United States Patent [19]

Naraki et al.

[11] Patent Number: 5,581,075
[45] Date of Patent: Dec. 3, 1996

[54] MULTI-BEAM SCANNING PROJECTION EXPOSURE APPARATUS AND METHOD WITH BEAM MONITORING AND CONTROL FOR UNIFORM EXPOSURE OF LARGE AREA

[75] Inventors: Tsuyoshi Naraki, Tokyo; Masamitsu Yanagihara, Yokohama; Hiroshi Shirasu; Tomohide Hamada, Yokohama; Tetsuo Kikuchi, Tokyo; Noriaki Yamamoto, Saitama-ken, all of Japan

[73] Assignee: Nikon Corporation, Tokyo, Japan

[21] Appl. No.: 446,509

[22] Filed: May 22, 1995

Related U.S. Application Data

[63] Continuation-in-part of Ser. No. 312,989, Oct. 3, 1994, abandoned.

[30] Foreign Application Priority Data

| Oct. 6, 1993 | [JP] | Japan | 5-249653 |
| Apr. 27, 1994 | [JP] | Japan | 6-112000 |
| Aug. 26, 1994 | [JP] | Japan | 6-225643 |
| Nov. 14, 1994 | [JP] | Japan | 6-304278 |

[51] Int. Cl.[6] ..................................................... G01J 1/32
[52] U.S. Cl. ........................... 250/205; 250/548; 355/69; 356/400
[58] Field of Search ................... 250/205, 201.2, 250/548, 555; 356/400, 401; 355/53, 69, 71, 68

[56] References Cited

U.S. PATENT DOCUMENTS

| 4,713,675 | 12/1987 | Yui | 355/69 |
| 4,947,030 | 8/1990 | Takahashi | 250/205 |
| 5,097,291 | 3/1992 | Suzuki | 355/69 |
| 5,250,797 | 10/1993 | Sano et al. | 250/548 |
| 5,347,118 | 9/1994 | Iwanaga | 250/205 |
| 5,420,417 | 5/1995 | Shiraishi | 250/205 |

FOREIGN PATENT DOCUMENTS

2-170152  6/1990  Japan .

*Primary Examiner*—Stephone Allen
*Attorney, Agent, or Firm*—Shapiro and Shapiro

[57] ABSTRACT

An exposure apparatus comprises a plurality of illumination optical systems for generating a plurality of light beams, a plurality of projection optical systems disposed corresponding to the plurality of illumination optical systems, respectively, a plurality of light intensity detectors, provided respectively for the plurality of illumination optical systems, for detecting individual intensities of the plurality of light beams, a light intensity changing device for changing the respective intensities of the plurality of light beams, and a control device for controlling the light intensity changing device and uniformizing the intensities of the plurality of light beams to a substantially fixed level.

43 Claims, 12 Drawing Sheets

5,581,075

MULTI-BEAM SCANNING PROJECTION EXPOSURE APPARATUS AND METHOD WITH BEAM MONITORING AND CONTROL FOR UNIFORM EXPOSURE OF LARGE AREA

This is a continuation-in-part of application of U.S. patent application Ser. No. 08/312,989 filed on Oct. 3, 1994 (abandoned).

BACKGROUND OF THE INVENTION

1. Field of the Invention

The present invention relates generally to an exposure apparatus and method and, more particularly, to an exposure apparatus and method used for manufacturing, e.g., a semiconductor device and a liquid crystal display substrate, and especially having a plurality of illumination optical systems.

2. Related Background Art

In recent years, a liquid crystal display substrate has been often employed as a display device for a personal computer, a TV, etc.. This liquid crystal display substrate is manufactured by effecting patterning of transparent thin-film electrodes in a desired shape on a glass substrate photolithography. Employed as a device for this lithography is a projection exposure apparatus for exposing original patterns formed on a mask onto photoresist layers on the glass substrate via projection optical systems.

Further, it has been recently demanded to increase an area of the liquid crystal display substrate. With this demand, it is desired that an exposure area of the projection exposure apparatus be enlarged.

SUMMARY OF THE INVENTION

A scan type exposure apparatus including a plurality of projection optical systems is considered as an apparatus for enlarging the exposure area. That is, a plurality of illumination optical systems are provided, and a mask is illuminated with light beams emitted from the respective illumination optical systems. Mask images illuminated with the light beams are projected on projection areas on a glass substrate via the plurality of projection optical systems, respectively.

More specifically, quantities of the light beams emitted from the light source are uniformized (equalized) through an optical system inclusive of a fly-eye lens, etc. and are thereafter shaped in a desired configuration by a field stop. Then, mask pattern surfaces are illuminated with the thus shaped light beams. A plurality of optical systems (illumination optical systems) having such a construction are disposed. Different small areas (illumination areas) on the mask are individually illuminated with the light beams emitted respectively from the plurality of illumination optical systems. The light beams penetrating the mask form mask pattern images on different projection areas on the glass substrate through projection optical systems different from each other. Then, scanning is performed with respect to the projection optical systems by synchronized movement of the mask with the glass substrate, thereby transferring the overall pattern areas on the mask onto the glass substrate.

The scan type exposure apparatus has the plurality of illumination optical systems, and, therefore, intensities of the light beams emitted from the respective illumination optical systems are required to be uniformized. For this purpose, the intensities of the light beams from the respective illumination optical systems are adjusted to a fixed level by use of an ND filter at a stage of manufacturing the apparatus. However, a state of deterioration in luminance of the light source (lamp) with a passage of use time of the apparatus is different per lamp, and hence the intensities of the light beams fluctuate during the use of the apparatus.

Further, when a lamp is replaced, an initial luminance differs per lamp, and it is required that the intensities of the light beams be adjusted once again. For facilitating this adjustment of the intensities, it can be considered that detectors are arranged within the respective illumination optical systems, and an application voltage to each lamp is feedback-controlled to set the intensities of the light beams to an arbitrary fiducial value on the basis of signals obtained by the detectors.

Generally, however, there is a manufacturing basis scatter (variation) in the luminances of the lamps, and also, the luminance decreases corresponding to the using time. It is therefore required that a minimum value of the scatter and of the luminance in a lifetime be set to the above fiducial value according to this method. Accordingly, the intensity of the light beams of each illumination optical system is always stabilized only at a low level, resulting in a decline of throughput of the apparatus with an increment of the exposure time.

Further, since the scan type exposure apparatus typically performs the exposure by movement in one direction of the mask and the glass substrate, it is difficult to detect the light intensities on the glass substrate over the entire areas of the exposure light beams.

As stated, in the above-described scan type exposure apparatus, the intensities of the light beams of the plurality of illumination optical systems are required to be uniformized. If there is an error in the intensity of the illumination light within each illumination area on the mask, it follows that line widths of patterns transferred within the respective projection areas on the glass substrate differ. Particularly, in the case of manufacturing an active matrix liquid crystal device, there is induced a decline in terms of quality of the device as a change in contrast.

FIG. 9A is a diagram illustrating three adjacent projection areas PA1 to PA3. Referring to FIG. 9A, each of the projection areas PA1 to PA3 takes the same trapezoidal shape. The projection areas adjacent to each other (e.g., PA1 and PA2, PA2 and PA3) are so arranged as to be displaced from each other by a predetermined quantity in a scan direction shown in the Figure. Further, the base and the upper side of each trapezoid extend in a direction (hereinbelow, simply termed a scan orthogonal direction) orthogonal to the scan direction on the whole, i.e., in the horizontal direction in the Figure. Then, triangular areas (hereinafter called joint portions) at the edges of the adjacent projection areas are so disposed as to be overlapped in the scan orthogonal direction in ranges shown by broken lines in the Figure. Thus, the configuration is such that there is a total sum of lengths of the projection areas along the scan direction in an arbitrary position in the scan orthogonal direction.

Further, FIG. 9B shows a typical intensity distribution of the light beams in the projection areas PA1 to PA3. That is, referring to FIG. 9B, the intensities of the light beams at the center and both edges of each projection area along the scan orthogonal direction are plotted.

As illustrated in FIG. 9B, the light intensities in the respective projection areas PA1 to PA3 are substantially coincident at central positions P2, P5, P8 thereof. Within the individual projection area, the intensity linearly varies in the perpendicular orthogonal direction, viz., a so-called slant unevenness is easy to produce.

The above scan type exposure apparatus is not equipped with an element for detecting and correcting this unevenness i.e. the slant unevenness in the scan orthogonal direction in each projection area. If an exposure scan is effected in the scan direction in such a state that the slant unevenness appears in the scan orthogonal direction, it follows that the slant unevenness of the exposure light quantity is left as it is in the scan orthogonal direction. Hence, there exists such a drawback that each area on the photosensitive substrate can not be scan-exposed with a fixed exposure light quantity.

An exposure apparatus disclosed in Japanese Patent Application No. 5-161588 corresponding to U.S. Ser. No. 259,771 is provided with an illumination optical apparatus including a plurality of illumination optical systems for illuminating respective areas on a mask with light beams emitted therefrom. Individual mask images formed when the plurality of areas are illuminated with the light beams are projection-exposed onto a plurality of projection areas on a photosensitive substrate through a plurality of projection optical systems. Then, the mask and the photosensitive substrate are relatively moved (scanned) with respect to the projection optical systems, thus transferring the whole pattern areas on the mask onto the photosensitive substrate.

In the so-called scan type exposure apparatus described above, the illuminances in the respective illumination areas on the mask are required to be uniformized in order to ensure a predetermined transfer accuracy. It is, however, predicted that some fluctuations in terms of the illuminance in the individual illumination areas are caused due to characteristic fluctuations (so-called scatters) in the respective illumination optical systems.

Accordingly, it is a primary object of the present invention, which was devised in view of the above points, to provide an exposure apparatus capable of projecting the light on a photosensitive substrate with a uniform light intensity when projecting images of a plurality of irradiated areas on the photosensitive substrate through a plurality of projection optical systems by irradiating the plurality of irradiated areas on a mask with light beams respectively from a plurality of illumination optical systems.

It is another object of the present invention to provide an exposure apparatus capable of correcting slant unevenness in a scan orthogonal direction in each illumination area and thus effecting a scan exposure on each area of a photosensitive substrate with a fixed exposure light quantity.

It is still another object of the present invention to provide an illumination optical apparatus capable of irradiating a plurality of illumination areas on an object such as, e.g., a mask with light beams exhibiting a substantially uniform illuminance.

To accomplish the above object, according to a first aspect of the invention, there is provided an exposure apparatus comprising: a plurality of illumination optical systems; a plurality of projection optical systems disposed corresponding to the plurality of illumination optical systems, respectively; a plurality of light intensity detectors, provided respectively for the plurality of illumination optical systems, for detecting intensities of the light beams individually from the plurality of illumination optical systems; a light intensity changing device for changing the intensities of the respective light beams of the plurality of illumination optical systems; and a control device for controlling the light intensity changing device to uniformize the intensities of the light beams to a fixed level, corresponding to the light beam intensities detected respectively by the light intensity detectors, wherein the images of the plurality of irradiated areas are projected on the photosensitive substrate through the plurality of projection optical systems.

According to a second aspect of the invention, the control device controls the light intensity changing device so that all of the plurality of light intensity detectors exhibit a minimum value when one, exhibiting the minimum value, of the light beam intensities detected respectively by the plurality of first light intensity detectors is fiducial.

According to a third aspect of the invention, the exposure apparatus further comprises a second light intensity detector for detecting an intensity of each of the light beams emitted from the plurality of illumination optical systems.

According to a fourth aspect of the invention, the control device corrects detected results of the light intensity detectors on the basis of a detected result of the second light intensity detector and the respective detected results of the plurality of light intensity detectors.

According to a fifth aspect of the invention, the light intensity changing device has a member exhibiting a transmittance lower than those of optical elements constituting the illumination optical systems.

According to a sixth aspect of the invention, the second light intensity detector is disposed on a moving unit mounted on a stage moving in a predetermined direction and moving in a direction orthogonal to the moving direction of the stage and detects light intensities of the individual light beams passing through the plurality of projection optical systems while moving within the same plane as the surface of the photosensitive substrate.

According to a seventh aspect of the invention, the control device, in advance of the exposure, controls the light intensity changing device of each of the illumination optical systems on the basis of detection data by the second light intensity detector, uniformizes the light intensities of the light beams on the surface of the photosensitive substrate and, when effecting the exposure, holds the light intensities of the respective light beams that are uniformized by the light intensity detector of each of the illumination optical system by controlling the light intensity changing device.

According to the present invention, the intensities of the light beams from the illumination optical systems disposed respectively for the plurality of projection optical systems are detected, and the control is conducted to match the intensities of other illumination optical systems with the intensity of the illumination optical system from which the minimum intensity is obtained. Thus, it is possible to obtain the uniform intensity in all of the illumination optical systems all the time irrespective of a scatter in terms of initial luminance of the light source and a deterioration of luminance due to the use.

Further, as in the above-described apparatus, unlike the apparatus in which the minimum luminance in the lifetime of the light source is preset as a fiducial value, the fiducial value is set to the luminance assuming a higher level than the minimum luminance. Hence, the luminance of the light source can be always effectively availed, and a drop in the throughput of the apparatus can be avoided.

Further, the second light intensity detector is capable of two-dimensionally detecting the light intensities of the entire projection areas, and, therefore, a more uniform exposure surface illuminance can be obtained by performing the control in consideration of non-uniformity of intensities of residual light beams in the respective projection areas. Then, the exposure surface illuminance can be kept constant regardless of the deterioration of the light source for the illumination optical system, and hence the exposure quantity can be easily accurately controlled.

According to an eighth aspect of the present invention, there is provided an exposure apparatus for projecting and exposing a predetermined pattern of a mask on a photosensitive substrate through a projection optical system while moving the mask and the photosensitive substrate in a predetermined direction with respect to the projection optical system for forming an image of the mask having the predetermined pattern on the photosensitive substrate, this exposure apparatus comprising: a plurality of illumination optical system for respectively forming a plurality of illumination areas on the mask; a plurality of projection optical systems for respectively forming images of the plurality of illumination areas on the mask in a plurality of projection areas on the photosensitive substrate; a detecting device for detecting a light intensity distribution along a direction orthogonal to the predetermined direction in each of the plurality of projection areas on the photosensitive substrate; and a control device for controlling each of the plurality of illumination optical systems to substantially uniformize the light intensity distribution in each of the plurality projection areas on the photosensitive substrate along the direction orthogonal to the predetermined direction on the basis of detected results of the detecting device.

According to a preferred mode of the present invention, the control device has a lens driving unit for tilting a predetermined lens in each of the illumination optical systems within a plane including the direction orthogonal to the predetermined direction and the optical axis. In this case, each of the plurality of illumination optical systems has an optical integrator for forming a multiplicity of secondary light sources on the basis of the light beams from a light source and a light converging optical system for converging the light beams from the optical integrator. The predetermined lens is preferably a negative lens among the lenses constituting the light converging optical system.

According to the present invention, there is detected the light intensity distribution along the scan orthogonal direction in each of the plurality of projection areas on the photosensitive substrate. Each illumination optical system is controlled to substantially uniformize this light intensity distribution along the scan orthogonal direction, i.e., to substantially eliminate the slant unevenness.

More specifically, the lens included in each of the illumination optical systems is tilted within the plane including the scan orthogonal direction and the optical axis or shifted in the scan orthogonal direction within the plane orthogonal to the optical axis, thus correcting the slant unevenness.

In this way, the exposure apparatus of the present invention is capable of correcting, the slant unevenness produced in the scan orthogonal direction in each projection area due to each projection optical system. Accordingly, each of the projection areas of the photosensitive substrate can be scan-exposed with a fixed exposure light quantity by minimizing variations in the light intensity distribution over the entire photosensitive substrate. As a result, transfer accuracy is improved, and quality of the device manufactured is remarkably enhanced.

According to a ninth aspect of the present invention, there is provided an illumination optical apparatus for illuminating a plurality of illumination areas on an object with light beams, this apparatus comprising: a light source unit for supplying illumination light beams; a multi-light-source-image forming device for respectively forming light source images in spatially separated positions by converging the illumination light beams from the light source unit; a plurality of blind members respectively disposed in the positions of the light source images formed by the multi-light-source-image forming unit and formed with variable apertures each assuming a predetermined shape; a plurality of illumination optical systems for illuminating the illumination areas on the object with the illumination light beams from the light source images by respectively converging the illumination light beams from the light source images through the blind members; a plurality of photo detecting devices for photoelectrically detecting the illumination light beams on the optical path of the illumination optical systems; and a control device for respectively controlling sizes of aperture areas of the plurality of blind members on the basis of the outputs from the plurality of photo detecting devices to equalize illuminances in the plurality of illumination areas on the object.

According to a preferred mode of the present invention, the light source unit has a plurality of light sources emitting illumination light beams having wavelengths equal to each other. The multi-light-source-image forming device has a plurality of light converging members for forming the light source images by respectively converging the illumination light sources from the plurality of light sources and a light guide member for relaying the respective light source images formed by the plurality of light converging members to the spatially separated positions. The blind members are disposed respectively at exit ends of the light guide member.

Alternatively, the multi-light-source-image forming device has light converging members for forming the light source images by converging the illumination light sources from the light source unit and a light guide member for split-relaying the light source images formed by the light converging members to the spatially separated positions. It is preferable that the blind members be disposed respectively at exit ends of the light guide member.

According to the present invention, the photo detecting device sequentially detects the illumination light beams falling on the plurality of areas on the object such as, e.g., the mask. The substantially uniform illuminance is to be obtained in each illumination area on the mask, and, for this purpose, the quantity of the illumination light beams passing through the blind member is properly changed by changing the size of the aperture area of the blind member.

Thus, according to the present invention, the size of the aperture area of the blind member is consecutively properly changed, thereby making it possible to perform the control to obtain the substantially uniform illuminance in the plurality of illumination areas on the object.

In this case, each aperture of the blind member is preferably varied to keep a shape substantially similar to the illumination area with the optical axis centered. Thus, the light quantity efficiency can be improved by setting each aperture of the blind member substantially similar to the illumination area (viz., similar to a sectional shape of the lens element of the optical integrator and a sectional shape of each exit end).

Further, if each aperture of the blind member is changed with the optical axis centered at all times, a centroidal position of the light quantity of the image of the exit surface of the optical integrator, which is formed on a pupil surface of each of the plurality of projection optical systems, is invariable irrespective of variations in the aperture area of the blind member. As a result, when controlling the blind, no adverse influence is exerted on the telecentricity of the exposure light beam, and performance of resolution of the projection optical system is not deteriorated.

BRIEF DESCRIPTION OF THE DRAWINGS

Other objects and advantages of the present invention will become apparent during the following discussion in conjunction with the accompanying drawings, in which:

FIG. 7A is a diagram showing a light intensity distribution before correcting the slant unevenness; FIG. 7B is a diagram showing a light intensity distribution after correcting the slant unevenness;

FIG. 9A is a diagram illustrating projection areas PA1 to PA3 through three adjacent projection optical systems; FIG. 9B is a diagram showing a typical light intensity distribution of exposure light beams in the projection areas PA1 to PA3;

DESCRIPTION OF THE PREFERRED EMBODIMENTS

(1) First Embodiment

Figure 1:
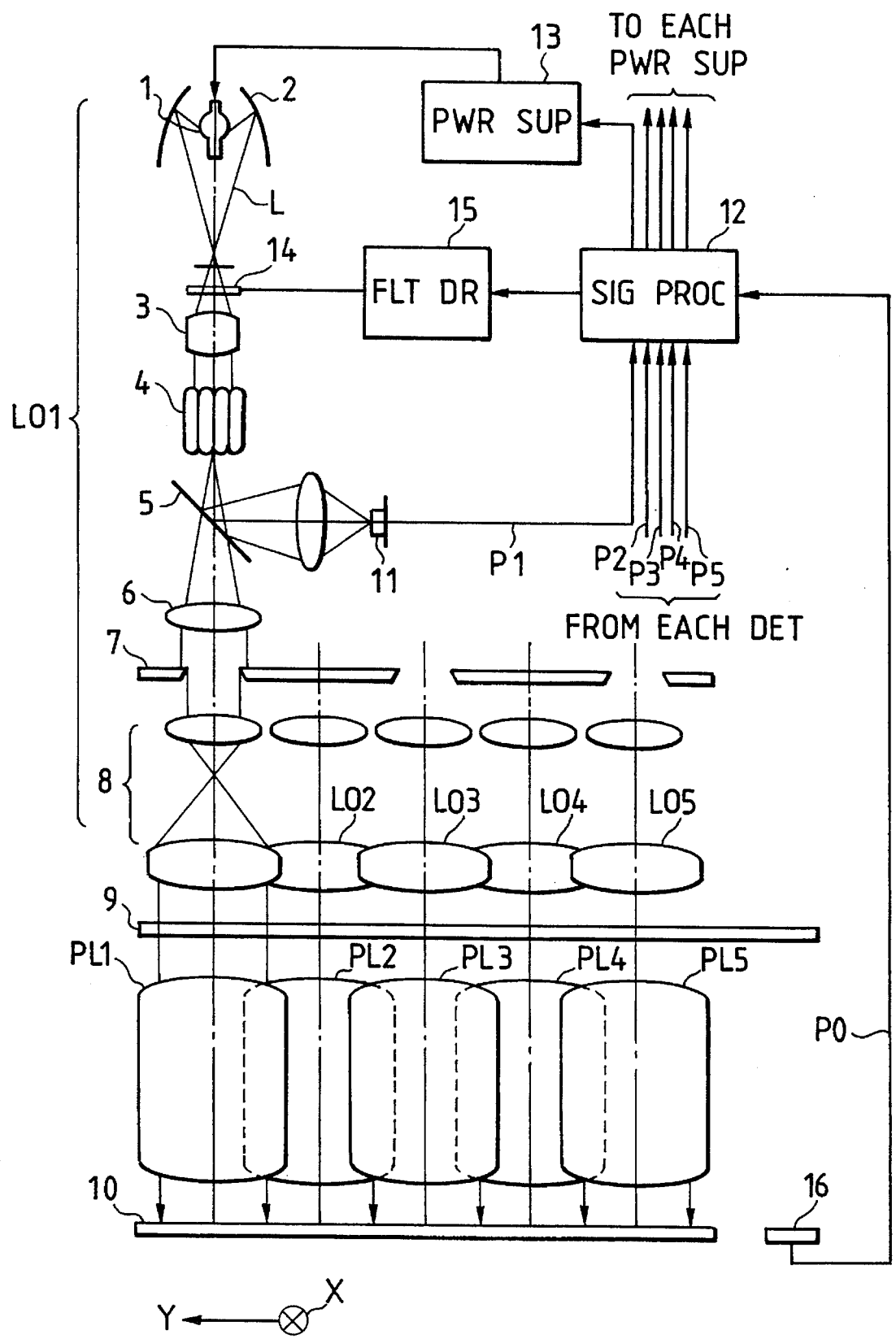
FIG. 1 is a schematic diagram illustrating a construction of an exposure apparatus in a first embodiment of the present invention.

FIG. 1 illustrates a construction of a first embodiment of an exposure apparatus according to this invention. Beams of light L emitted from a light source 1 such as an extra-high pressure mercury lamp, etc. are uniformized in terms of intensity by a fly-eye lens 4 through an elliptical mirror 2 and a lens system 3. Then, the light beams are shaped in a desired configuration by a field stop 7 via a half-mirror 5 and a lens system 6; and an image of the field stop 7 is formed on a pattern surface of a mask 9 through a lens system 8.

A plurality of illumination optical systems (optical elements, designated by LO1 to LO5, extend from the light source 1 to the lens system 8. In the Figure, however, only one complete illumination optical system LO1 is illustrated for convenience. Each of different small areas (illumination areas) on the mask 9 is illuminated with a beam of light emitted from each of the plurality of illumination optical systems LO1 to LO5. The plural beams of light penetrating the mask 9 form patterns image corresponding to the illumination areas of the mask 9 in different projection areas (shown by PA1 to PA5 in FIG. 2) on a photosensitive substrate 10 through projection optical systems PL1 to PL5 different from each other.

Figure 2:
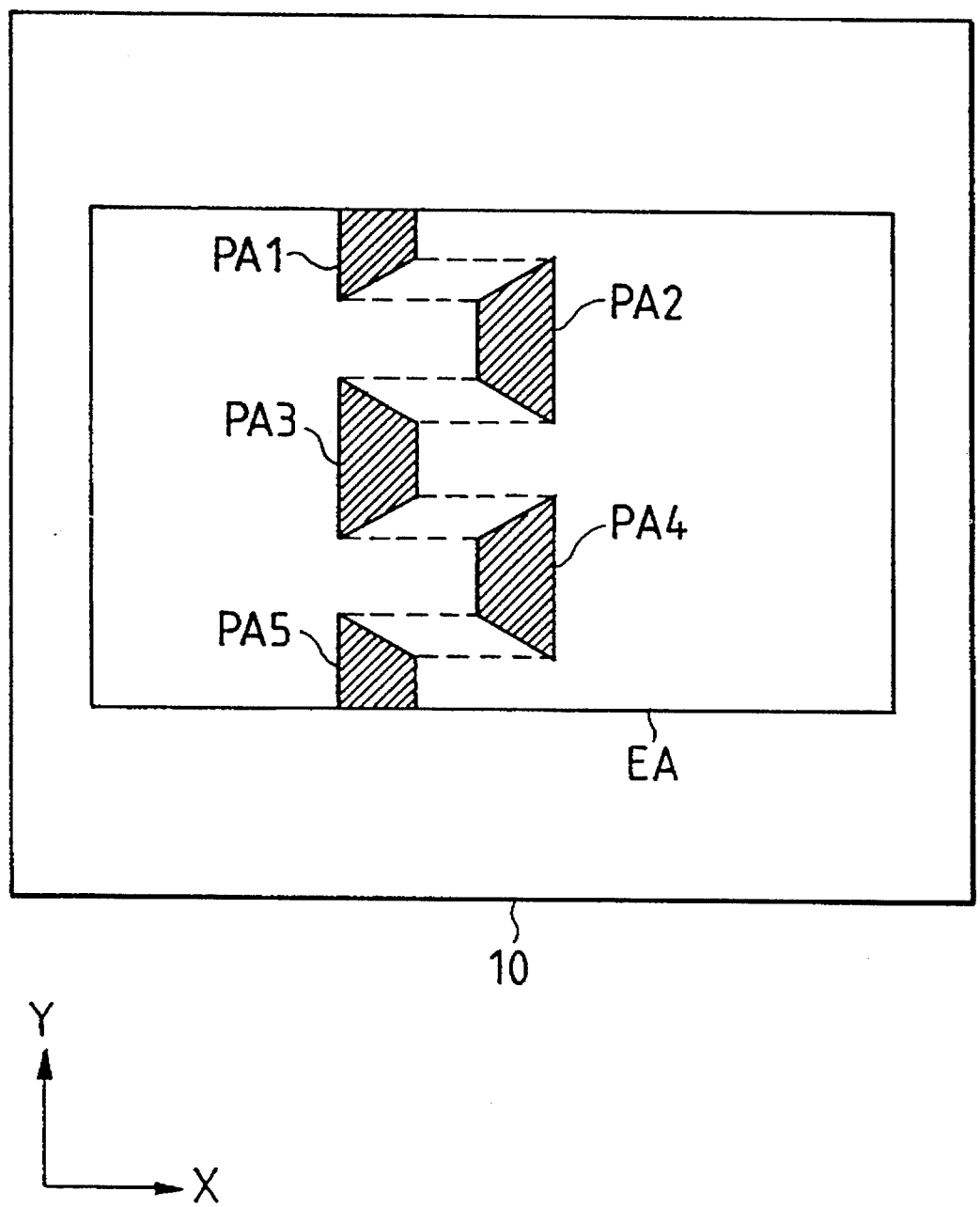
FIG. 2 is a schematic diagram showing projection areas on a photosensitive substrate in the exposure apparatus of FIG. 1.

In this case, each of the projection optical systems PL1 to PL5 is a unit erecting system. The projection areas adjacent to each other (e.g., PA1, PA2 and PA2, PA3) on the photosensitive substrate 10 are, as illustrated in FIG. 2, arranged so that the projection areas are displaced by a predetermined quantity in the X-direction in the Figure and so that the edges (Y-directional regions shown by broken lines in the Figure) of the adjacent areas are overlapped with each other in the Y-direction in the Figure. The plurality of projection optical systems PL1 to PL5 are also displaced by a predetermined quantity in the X-direction, corresponding to the placement of the projection areas PA1 to PA5 and, at the same time, arranged in superposition in the Y-direction.

Further, the plurality of illumination optical systems LO1 to LO5 are arranged so that the illumination areas on the mask 9 are disposed in the same way with the projection areas PA1 to PA5. Then, X-directional (direction perpendicular to the sheet surface in the Figure) scanning is performed through the projection optical systems PL1 to PL5 by synchronized movement of the mask 9 with the photosensitive substrate 10, thereby transferring the overall pattern areas on the mask 9 onto an exposure area EA (FIG. 2) on the photosensitive substrate 10.

The half-mirror 5 is provided on an optical path of the illumination optical systems LO1 to LO5, whereby some of the light beams L are incident on detectors 11. The detectors 11 always detect intensities of these light beams L and input signals P1 to P5 thus obtained to a signal processor 12. Based on the signals P1 to P5, the signal processor 12 obtains the intensities of the light beams L of the illumination optical systems LO1 to LO5 and sets one, exhibiting the minimum value, of these intensities as a fiducial value. Then, an application voltage (or power supply current) to the power supply 13 is feedback-controlled to equalize the intensities of other beams to this fiducial value. Note that an interval at which the signal processor 12 processes the signals P1 to P5 can be arbitrarily set according to necessity.

By the way, when some of the plurality of light sources 1 are replaced with new ones, these new light sources have a luminance higher than those of others. In this case, as stated earlier, it is impossible to control the intensity of each light beam to a fixed magnitude simply by regulating the application voltage. Hence, the construction is such that an ND filter 14 is so disposed as to be retractable with respect to the light beam L in the optical path of each of the illumination optical systems LO1 to LO5; and, a filter driving device 15 is controlled by a signal from the signal processor 12. Provided are a plurality of ND filters 14 each having a different transmittance. These ND filters 14 may be so used as to be individually switched over or combined.

In accordance with this embodiment, the detectors 11 need to calibrate scatters in detected values of the detectors 11 themselves for each of the illumination optical systems LO1 to LO5, including the transmittances of the optical elements constituting the illumination optical systems LO1 to LO5 and the projection optical systems PL1 to PL5. For this purpose, detectors 16 are provided so that light receiving surfaces are disposed within the same plane as the photosensitive substrate 10. Then, the detectors 16 are disposed in the projection areas PA1 to PA5 of the projection optical systems PL1 to PL5, thereby detecting the intensities of the light beams falling on the respective projection areas.

Thus obtained intensity signals P0 are inputted to the signal processor 12. Differences between the signals P0 for every projection area and the detected signals P1 to P5 of the detectors 11 of the illumination optical systems LO1 to LO5 are set as offsets of the respective detectors 11. This makes it possible to accurately control the intensities of the light beams. Further, it is also possible to check linearity of each of the detected signals P1 to P5 of the detectors 11 by switching the ND filter 14.

(2) Second Embodiment

Figure 3:
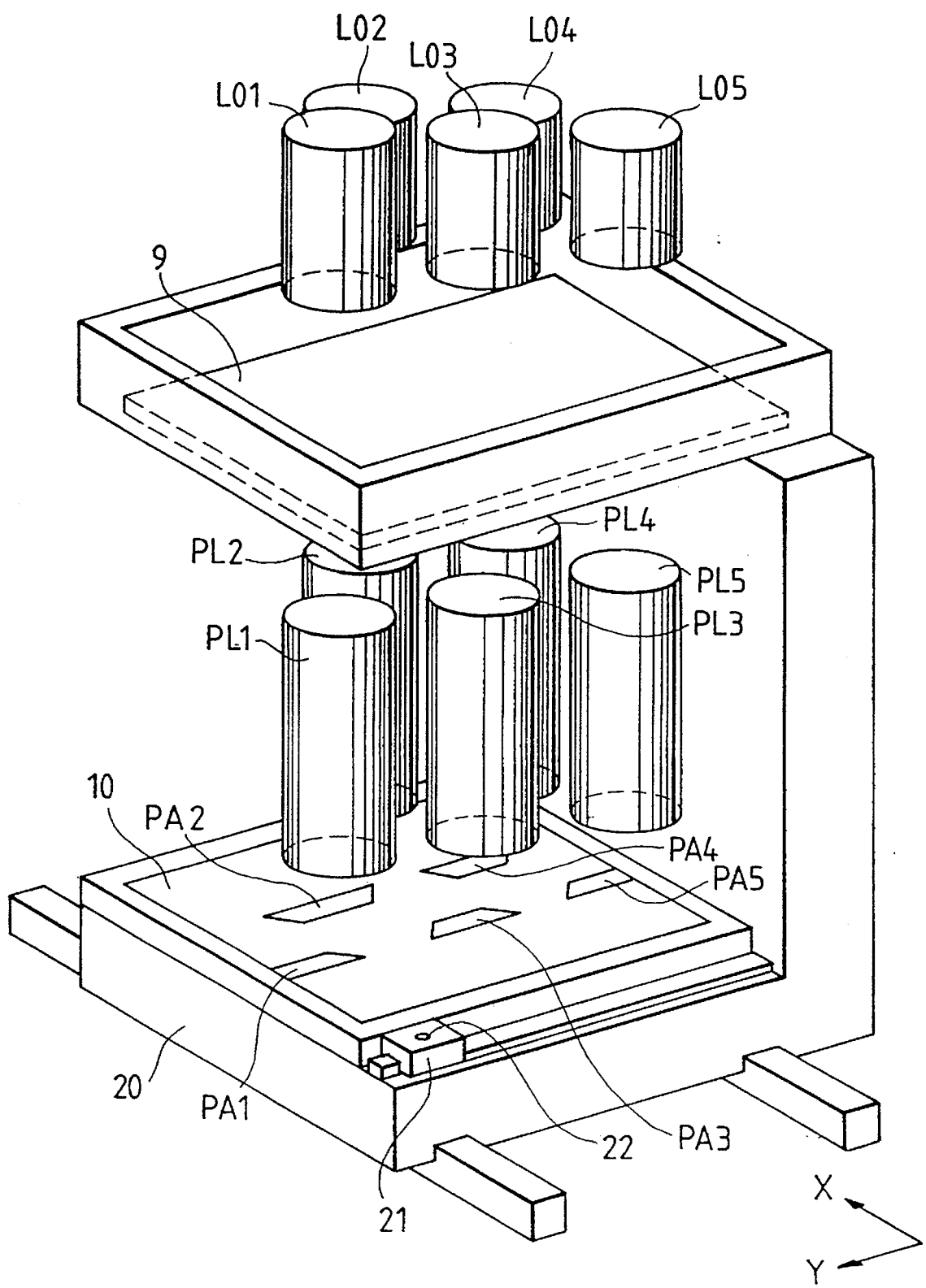
FIG. 3 is a schematic perspective view illustrating a construction of the exposure apparatus in a second embodiment of this invention.

FIG. 3 illustrates a structure of the exposure apparatus in a second embodiment of the present invention, wherein the elements corresponding to those in FIG. 1 are marked with the same symbols. This exposure apparatus is formed with an exposure stage 20 for integrally holding a mask stage mounted with the mask 9 and a substrate stage mounted with the photosensitive substrate 10. An alignment between the mask 9 and the photosensitive substrate 10 is conducted by an unillustrated alignment system with respect to the projection optical systems PL1 to PL5 and the illumination optical systems LO1 to LO5 which are respectively fixed to unillustrated support members. Thereafter, scan-exposures are effected together on the exposure stage 20 in a state where the mask 9 and the photosensitive substrate 10 are held on the exposure stage 20, thereby transferring mask images onto the photosensitive substrate 10. At this time, an exposure quantity is determined by an intensity of the illumination light on the photosensitive substrate 10 and a scanning speed of the exposure stage 20.

Further, in the exposure apparatus in this embodiment, a sensor driving device 21 having a moving shaft (X-axis) of the relevant exposure stage and a driving shaft (Y-axis) orthogonal to the moving shaft is mounted on the substrate stage of the exposure stage 20. A detector 22 is so mounted on this sensor driving device 21 as to be flush with the photosensitive substrate 10. Then, in advance of one or a plurality of exposures, a scan of the detector 22 is effected under the projection areas PA1 to PA5 of the projection optical systems PL1 to PL5 by driving the moving shaft (X-axis) of the exposure stage 20 and the driving shaft (Y-axis) of the sensor driving device 21. Thus, the illumination light intensities on the exposure surface are two-dimensionally measured and transmitted as items of light intensity data.

Figure 4:
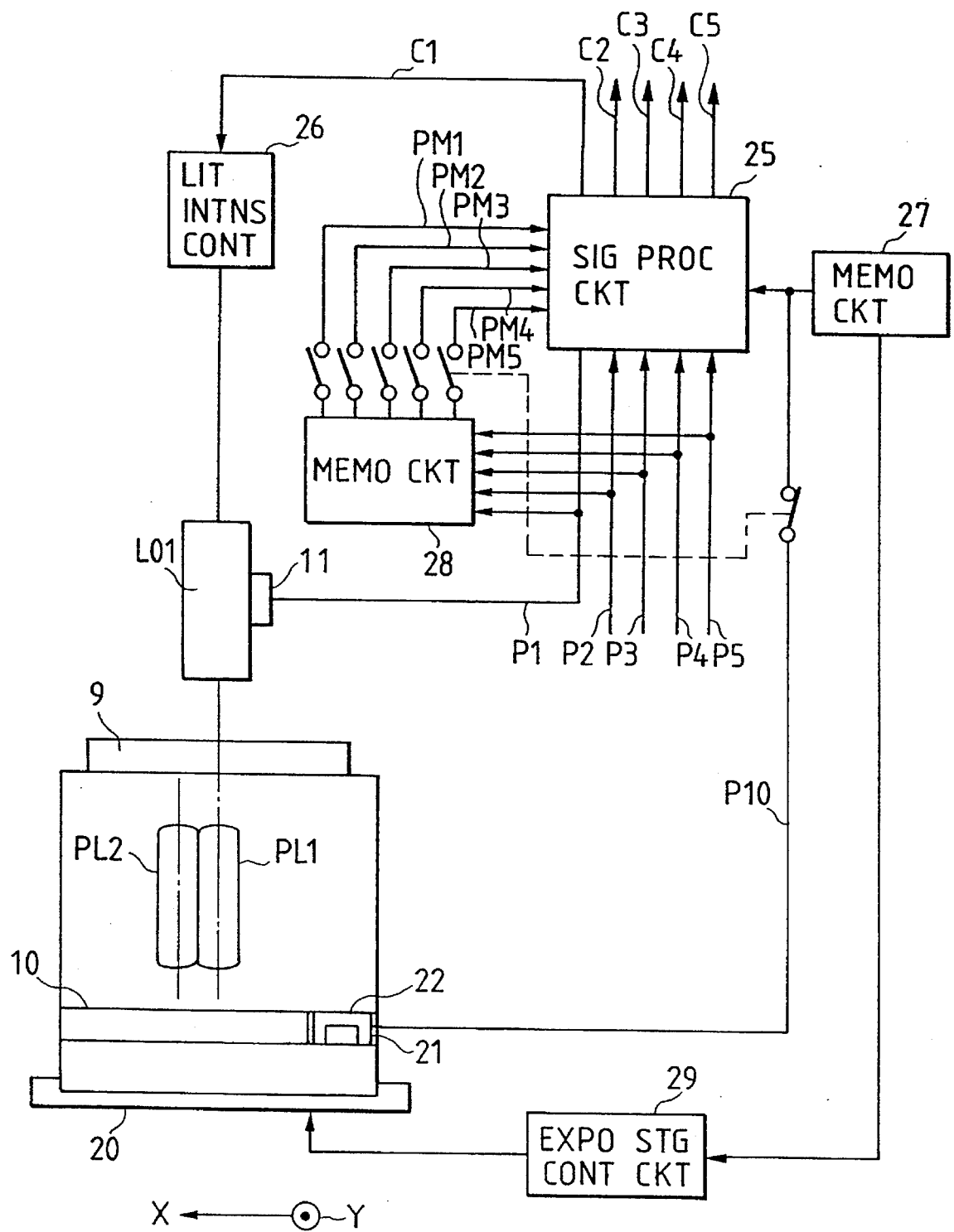
FIG. 4 is a schematic diagram of assistance in explaining a control system of a light quantity in the exposure apparatus of FIG. 3.

FIG. 4 shows a control system of the illumination light intensity in accordance with this second embodiment. Based on light intensity data P10 on the exposure surface (projection areas) which are measured in the same way as the above-mentioned, the detectors 11 provided relative to the illumination optical systems LO1 to LO5 detect (P1 to P5) the light intensities of the illumination optical systems LO1 to LO5 corresponding to the respective projection optical systems PL1 to PL5. Meanwhile, the illumination light intensities are set uniform within the entire exposure area into which the projection areas PA1 to PA5 of the projection optical systems PL1 to PL5 are combined together by controlling an illumination light intensity controller 26.

After setting has done, the detector 22 again measures and confirms the illumination light intensities on the exposure surface in the same procedures as the above-mentioned. When the uniformity of the illumination light intensity comes under the standard by repeating the above procedures, a memory circuit 27 stores, as an exposure surface illuminance, a measured value P10 on the exposure surface by the detector 22 at this time. On the other hand, a memory circuit 28 simultaneously stores detected values P1 to P5 by the detectors 11 of the illumination optical systems LO1 to LO5 at this time. During an actual exposure, an exposure stage control circuit 29 controls a moving speed of the exposure stage 20 to optimize the exposure quantity of the photosensitive substrate 10 on the basis of the exposure surface illuminance stored in the memory circuit 27.

Simultaneously with this, the illumination light intensities of the illumination optical systems LO1 to LO5 are controlled by the individual illumination light intensity controllers 26 so that the detected values P1 to P5 of the detectors 11 are held to the values PM1 to PM5 stored in the memory circuit 28. Current control of the light source and a zoom optical system and positional control of the ND filter in which the transmittance obliquely changes depending on locations are performed by way of a specific example of the illumination light intensity controller 26. In this manner, the light intensities (illuminances) of the overall projection areas PA1 to PA5 can be uniformized and kept constant.

According to the construction given above, the light intensities of the entire projection areas PA1 to PA5 are two-dimensionally detectable, and, therefore, the light intensities are controlled in consideration of non-uniformity in the intensities of the residual light beams within the respective projection areas, thereby making it possible to obtain a more uniform exposure surface illuminance. Further, the exposure surface illuminance can be kept constant regardless of deteriorations of the light sources of the illumination optical systems LO1 to LO5, and, hence, the control of the exposure quantity is facilitated and becomes accurate. Note that resetting of the exposure surface illuminance may be performed when the illumination intensity controller 26 becomes incapable of the control because of a predetermined number of exposures or a predetermined exposure time or due to the deteriorations of the light sources of the illumination optical systems LO1 to LO5.

(3) Other Embodiments

Incidentally, the construction in the embodiments discussed above is that the illumination optical systems LO1 to LO5 and the projection optical systems PL1 to PL5 are arranged so that the projection areas PA1 to PA5 are disposed as illustrated in FIG. 2. There may be, however, admitted such a construction that the illumination optical systems LO2, LO4 and the projection optical systems PL2, PL4 which form the projection areas PA2, PA4 shown in FIG. 2 are not provided. In this case, the mask 9 and the photosensitive substrate 10 are scanned in the X-direction, thereafter stepped by a predetermined quantity in the Y-direction and re-scanned in the direction opposite to the X-direction. The entire surface of the mask pattern areas can be transferred onto the photosensitive substrate.

Further, the embodiments discussed above involve the use of the unit projection optical systems PL1 to PL5 but may use projection optical systems having predetermined magnifications; and, there is no problem when employing reflection optical systems instead of the refraction optical systems. However, although aperture configuration of the field stop is trapezoidal, the present invention is not, however, confined to this configuration but may employ a field stop having, e.g., a hexagonal aperture.

Still another embodiment of the present invention will hereinafter be discussed with reference to the accompanying drawings.

Figure 5:
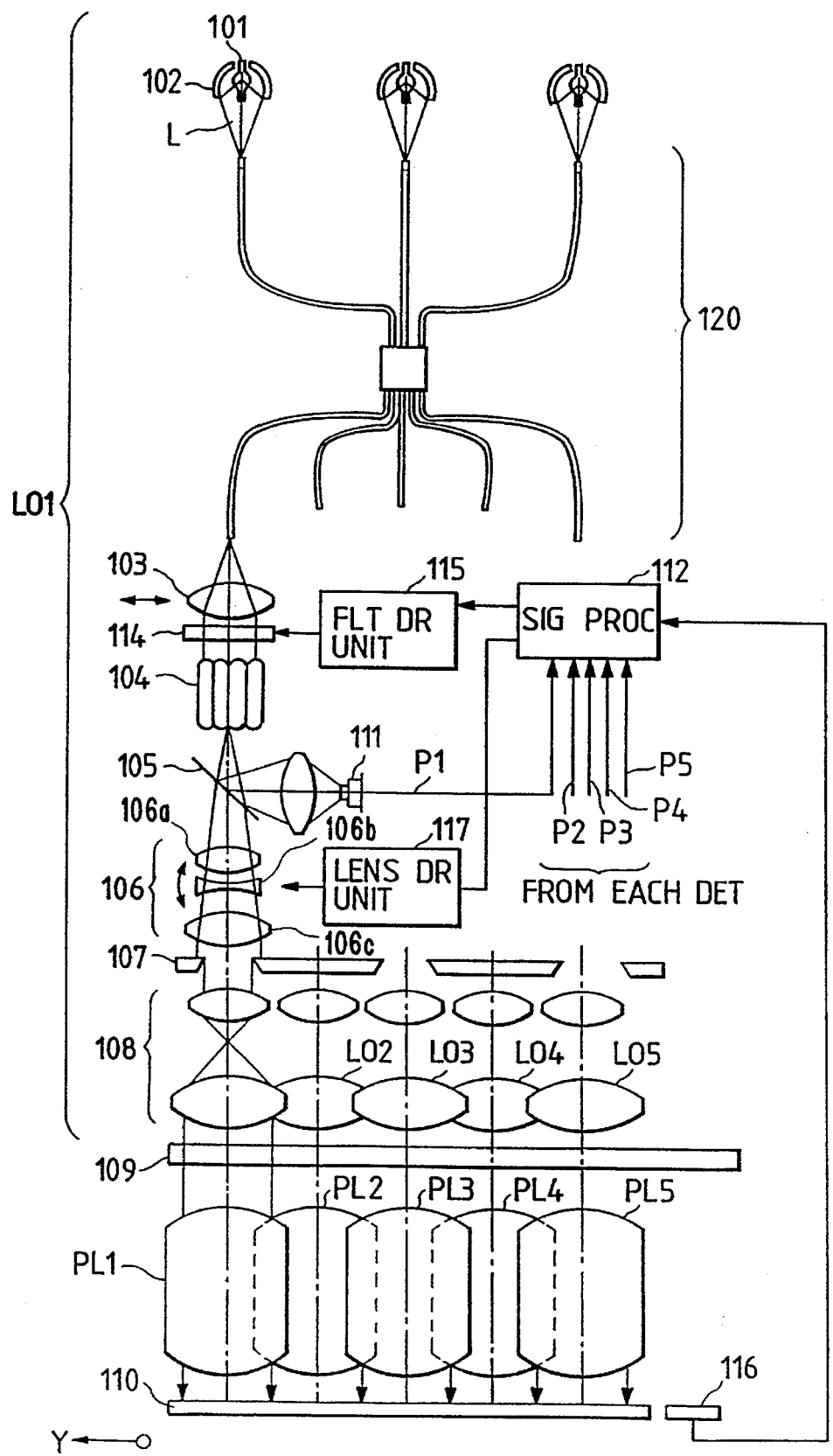
FIG. 5 is a schematic diagram illustrating a construction of the exposure apparatus in still another embodiment of the present invention.

FIG. 5 is a view schematically illustrating a construction of the exposure apparatus in this embodiment of the present invention.

The illustrated apparatus includes three light sources 101 each constructed of, e.g., an extra-high pressure mercury lamp. The light beams emitted from the respective light sources 101 are converged by an elliptical mirror 102 and incident on an incident end of a light guide 120. The light guide 120 is composed of, e.g., a plurality of optical fibers bundled at random and has three incident ends and five exit ends. Then, the optical fibers are diverged with equal numbers from the respective exit ends so that light quantities of the light beams outputted from the individual exit ends are substantially uniformized irrespective of fluctuations in terms of outputs of the light sources 101.

Thus, the light beams from the individual exit ends of the light guide 120 form secondary light sources in respective illumination optical systems. The light beams from the individual exit ends are collimated into parallel light beams through a lens 103. Thereafter, the light beams penetrate a transmissivity adjusting filter 114 such as, e.g., an optical modulation element in which transmissivity varies corresponding to an applied voltage and are then incident on a fly's eye lens 104 serving as an optical integrator.

The light beams, intensities of which are uniformized through the fly's eye lens 104, are shaped in a desired configuration, e.g., a trapezoidal configuration by a field stop 107 through a half-mirror 105 and a lens system 106. The light beams shaped in the trapezoidal configuration by the field stop 107 form an image of the field stop 107 on a pattern surface of a mask 109 through a lens system 108.

Note that the lens system 106 is constructed of, sequentially from the light source side, a positive lens element 106a, a negative lens element 106b and a positive lens element 106c.

Thus, the apparatus includes the light sources 101 and the light guide 120 that are defined as common components, and the lens 103, the transmissivity adjusting filter 114, the fly's eye lens 104, the half-mirror 105, the lens system 106, the field stop 107 and the lens system 108 are combined to constitute one illumination optical system. Note that FIG. 5 illustrates the whole construction of only a first illumination optical system LO1, and there are shown only some of the constructions of other four illumination optical systems LO2 to LO5.

The light beams from each illumination optical system respectively fall on individual small areas (illumination areas) on the mask 109. Respective projection areas on a photosensitive substrate 110 are irradiated with the light beams penetrating the respective illumination areas on the mask 109 through projection optical systems PL1 to PL5 of corresponding equi-powered erecting systems. In this way, pattern images corresponding to the respective illumination areas of the mask 109 are formed in the respective projection areas on the photosensitive substrate 110.

Figure 6:
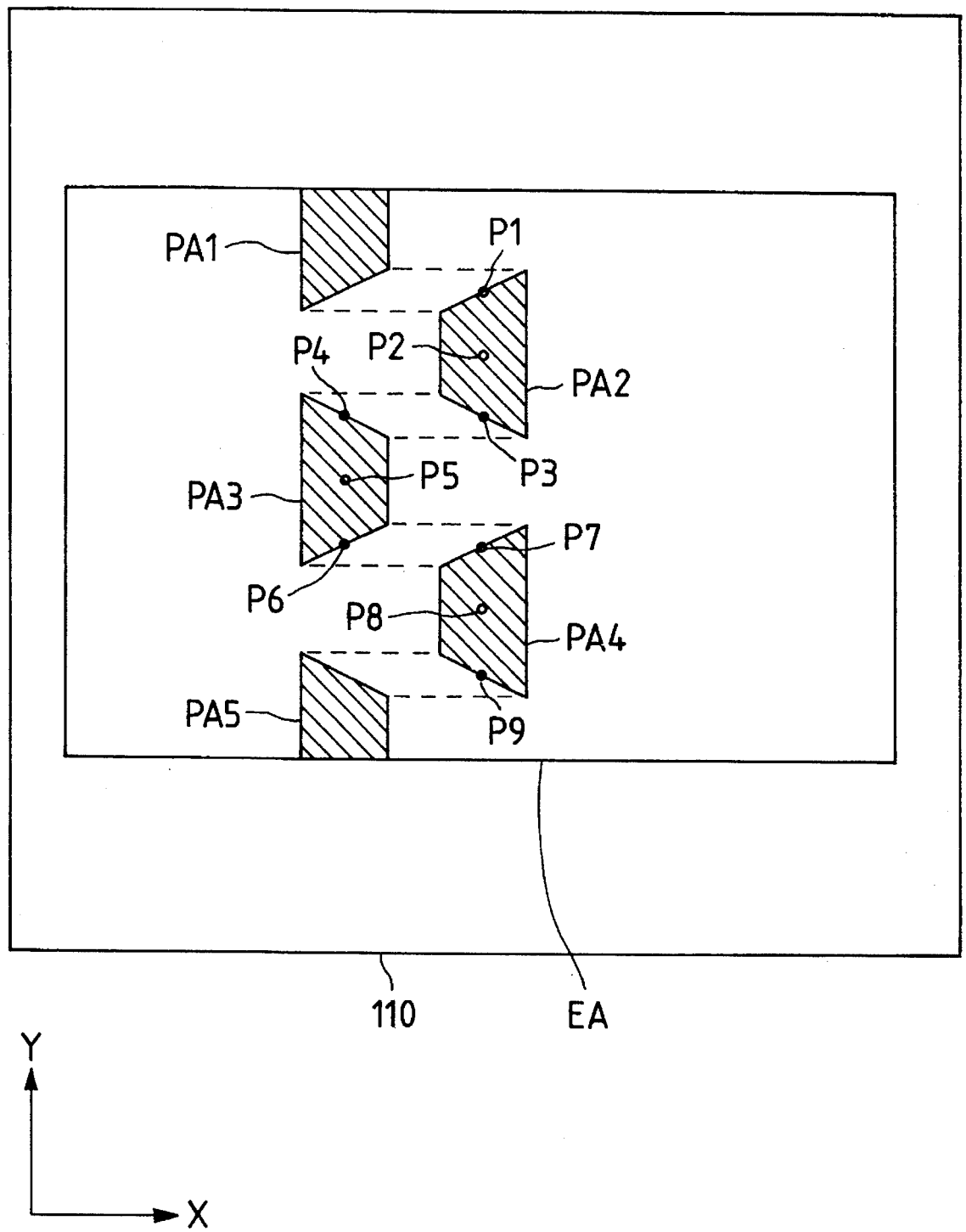
FIG. 6 is a diagram showing projection areas on the photosensitive substrate in the apparatus of FIG. 5.

FIG. 6 is a view illustrating the projection areas on the photosensitive substrate in the embodiment discussed above.

As shown in the Figure, each projection area takes the same trapezoidal configuration, and the projection areas adjacent to each other (e.g., PA1 and PA2, PA2 and PA3) are so arranged as to be displaced from each other by a predetermined quantity in the X-direction. Further, the base and the upper side of each trapezoid extend in the Y-direction (scan orthogonal direction) on the whole. Then, the projection areas are disposed so that joint portions of the adjacent projection areas are overlapped with each other in the Y-direction (scan orthogonal direction) in a region indicated by broken lines in the Figure. In other words, the arrangement is such there is a total sum of lengths of the projection areas along the X-direction (scan direction) in an arbitrary position in the Y-direction (scan orthogonal direction).

Note that the plurality of corresponding projection optical systems PL1 to PL5 and corresponding illumination optical systems LO1 to LO5 are also disposed in the same way with the projection areas PA1 to PA5, thus obtaining the above-described placement of the projection areas PA1 to PA5.

Then, an X-directional (direction perpendicular to the sheet surface in FIG. 5) scan is effected through the projection optical systems PL1 to PL5 while synchronizing movement of the mask 109 with the photosensitive substrate 110. The whole pattern areas on the mask 109 are thereby transferred on an exposure area EA on the photosensitive substrate 110.

Further, some of the light beams L are reflected by the half-mirror 105 provided on an optical path of each of the illumination optical systems LO1 to LO5 and then incident on a detector 111. The detectors 111 receive the incident beams and output signals P1 to P5 obtained by photoelectric conversions to a signal processor 112.

The signal processor 112 obtains intensities of the light beams of the respective illumination optical system on the basis of the signals P1 to P5. The signal processor 112 sets the minimum-value intensity among those intensities as a fiducial value. A filter drive unit 115, upon receiving an item of light intensity data given from the signal processor 112, properly changes the transmissivity of the transmissivity adjusting filter 114 of each illumination optical system so that the intensities of other light beams are substantially coincident with this fiducial value.

As explained above, even when the outputs of the light sources 101 fluctuate, light quantities substantially equal to each other are obtained at the output ends of the light guide 120, and, hence, the light intensities detected by the detectors 111 are substantially equal with respect to the individual illumination optical systems. As in the case of the embodiment of FIG. 1, however, the transmissivity adjusting filter 114 is additionally provided to correct the intensity of the light beam from each illumination optical system, thereby making it possible to further accurately uniformize the intensities of the light beams from the respective illumination optical systems.

Figure 7A:
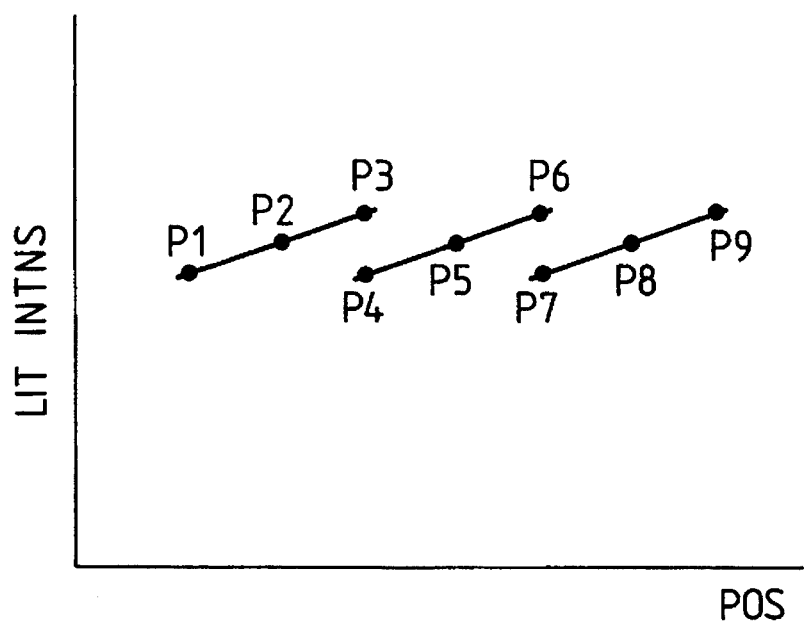
FIGS. 7A and 7B are diagrams of assistance in explaining how a slant unevenness in the projection area of the apparatus of FIG. 5 is corrected.
Figure 7B:
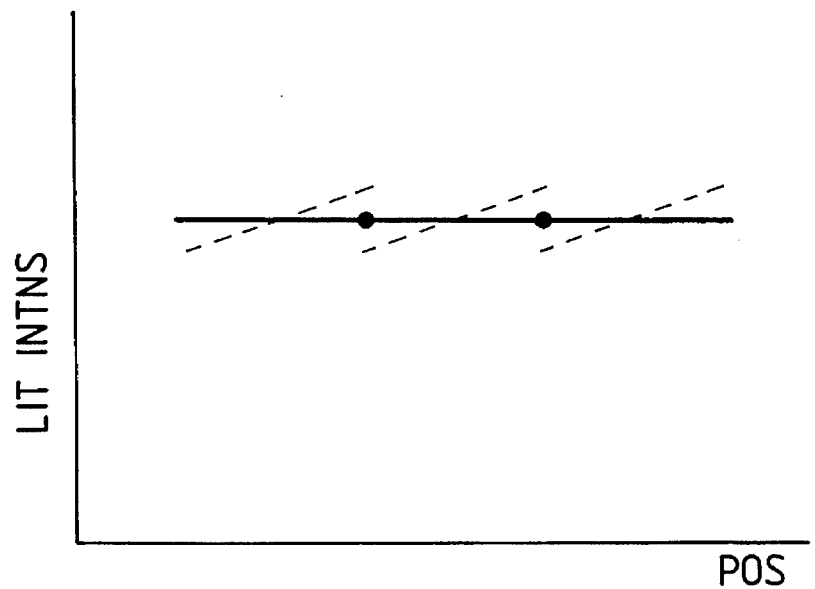

FIGS. 7A and 7B are diagrams of assistance in explaining how a slant unevenness in the projection areas is corrected. FIG. 7A illustrates a distribution of the light intensities before correcting the slant unevenness with respect to the three adjacent projection areas PA2 to PA4 of FIG. 2. FIG. 7B illustrates a distribution of the light intensities after correcting the slant unevenness. Hereinbelow, an operation of correcting the slant unevenness will be explained with reference to FIGS. 7A and 7B.

To start with, in advance of the projection exposure, as shown in FIG. 5, a Y-directional (scan orthogonal direction) scan is performed by a detector 116 within the plane flush with the photosensitive substrate 110 as illustrated in FIG. 5. A light intensity distribution along the Y-direction in the respective projection areas is measured and then memorized.

To be specific, referring to FIG. 6, the intensities of the light beams are measured in positions P1 to P9 at both ends as well as at the center along the Y-direction (scan orthogonal direction) of the projection areas PA2 to PA4. The data about the measured light intensities are inputted to the signal processor 112. Thus, the signal processor 112 obtains a light intensity distribution in the respective projection areas, which substantially linearly varies in the scan orthogonal direction as illustrated in FIG. 7A.

Next, a lens driving unit 117, upon receiving the light intensity distribution data given from the signal processor 112, properly tilts the negative lens 106b of the lens system 106 of each illumination optical system as indicated by an arrowheads in the Figure. That is, within the sheet surface in FIG. 5, the negative lens 106b is properly tilted.

In this way, the light intensity distribution in the scan orthogonal direction in the respective projection areas can be, as shown in FIG. 7B, substantially uniformized. As stated earlier, the arrangement is such that the light intensities in the central positions P2, P5 and P8 of the projection areas are substantially coincident with each other, and, therefore, the light intensities can be substantially uniformized all over the projection areas by correcting the slant unevenness of each projection area.

Incidentally, in other embodiments, if the light intensities of the joint portions between the adjacent projection areas are different after correcting the above slant unevenness, the transmissivity adjusting filter 114 is properly controlled so that the light intensities of the adjacent joint portions are substantially coincident with each other.

Further, the embodiment discussed above has a construction in that each of the illumination optical systems includes the common light source 101 and the light guide 120, and each of the exit ends of the light guide 120 serves as a secondary light source.

In place of the construction involving the use of the light guide 120 described above, the construction may be such that each illumination optical system has a light source. Given hereinbelow is an explanation of an embodiment constructed so that each illumination optical system includes a light source, with reference to FIG. 8. Note that the members incorporating the same functions as those in the embodiment illustrated in FIG. 5 are marked with the like numerals in FIG. 8.

Figure 8:
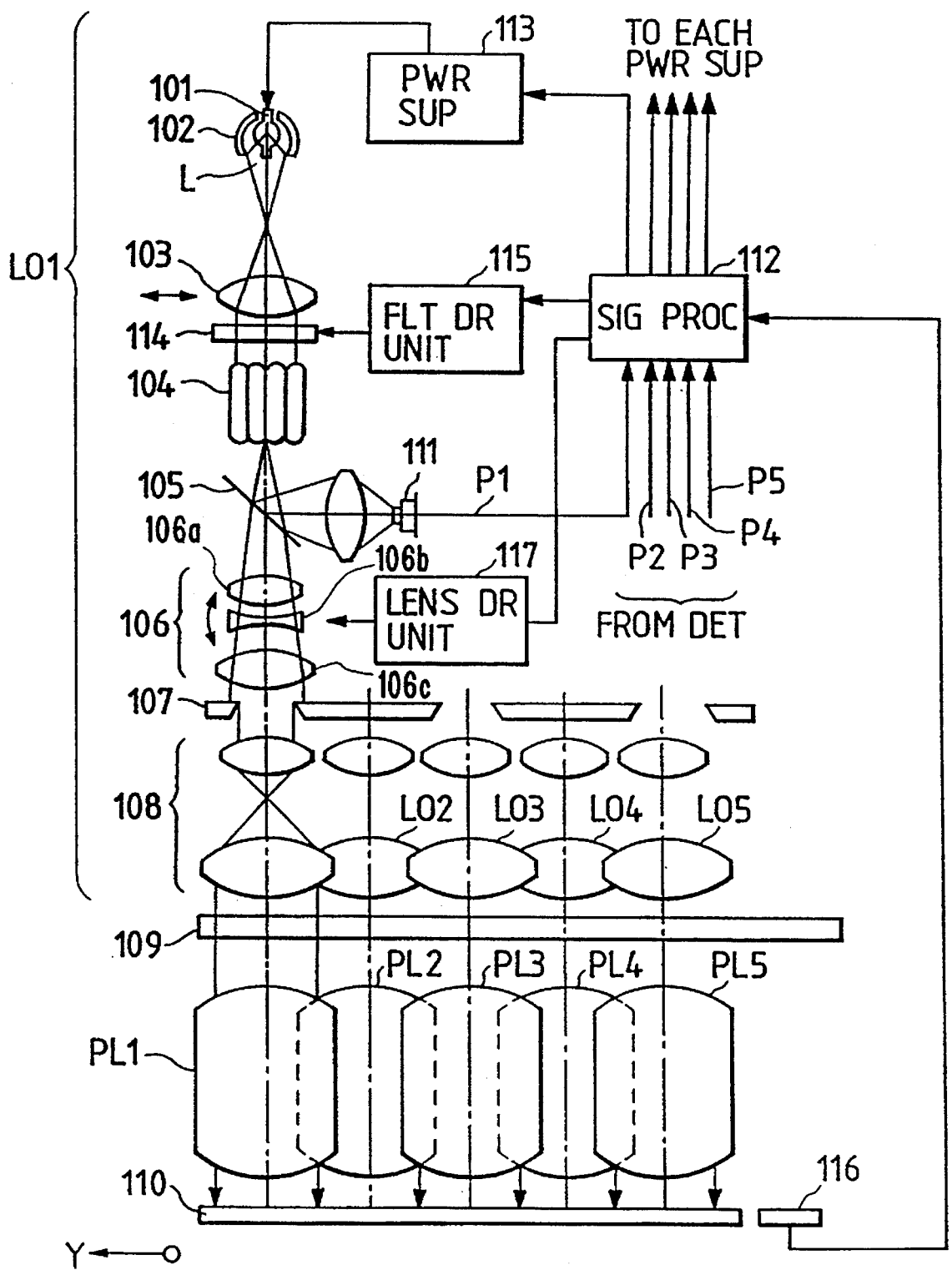
FIG. 8 is a schematic diagram illustrating a construction of the exposure apparatus in yet another embodiment of the present invention.
Figure 9A:
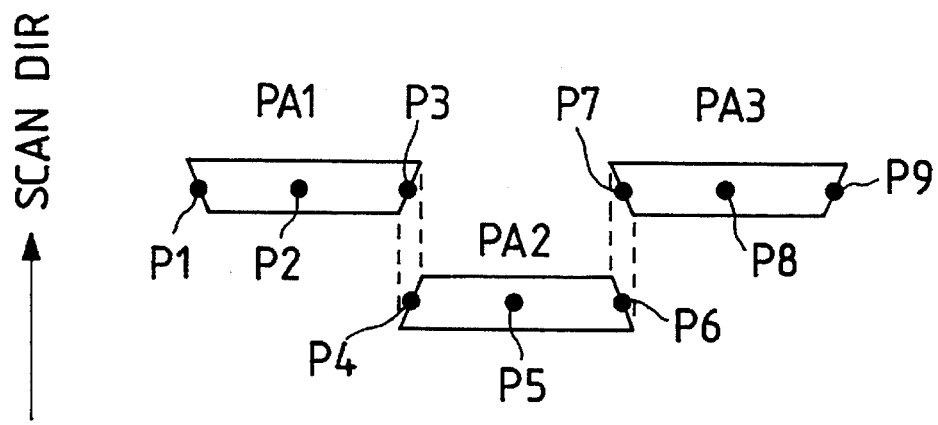
FIGS. 9A and 9B are diagrams of assistance in explaining drawbacks inherent in the prior art.
Figure 9B:
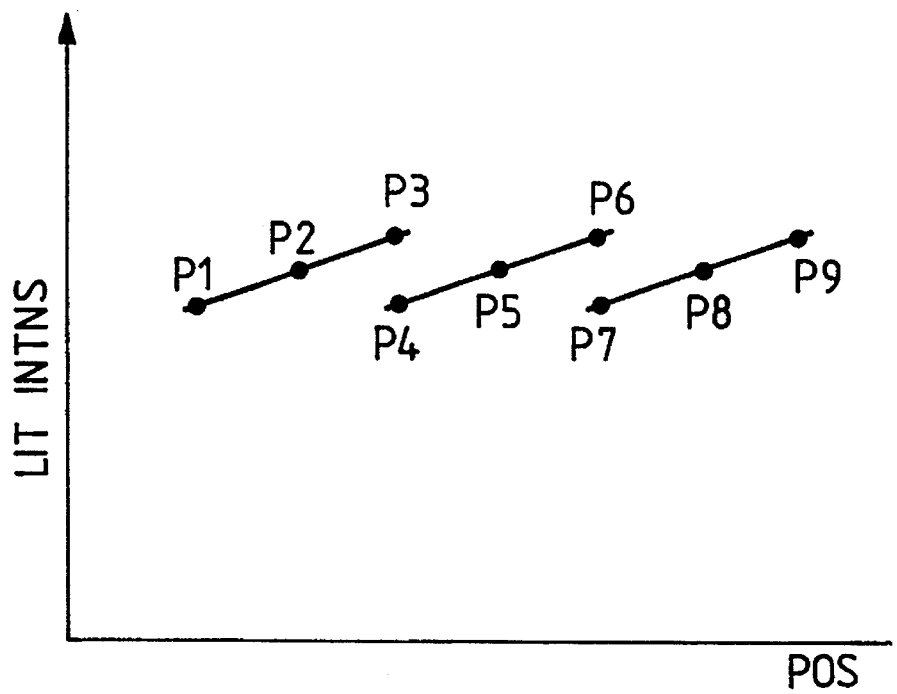

Referring to FIG. 8, the light beams L emitted from the light source 101 are converged through the elliptical mirror 102 and then collimated into parallel light beams via the lens 103. The light beams through the lens 103, as in the same way with the embodiment of FIG. 5, form the illumination areas on the mask 109 sequentially through the transmissivity adjusting filter 114, the fly's eye lens 104, the half-mirror 105, the lens system 106, the field stop 107 and the lens system 108. Note that FIG. 8 illustrates the whole configuration of the first illumination optical system LO1 but only positional configurations with respect to the other four illumination optical systems LO2 to LO5.

The embodiment of FIG. 8 has a construction different from the embodiment of FIG. 5 in that the signal processor 112 controls a power supply 113 for adjusting an applied voltage to the light source 101 in each illumination optical system. Herein, the signal processor 112 obtains the intensities of the light beams of the respective illumination optical system on the basis of the signals P1 to P5 from the detectors 111. The signal processor 112 sets the minimum-value intensity among those intensities as a fiducial value. Further, the signal processor 112 controls the applied voltage of the power supply 113 to each light source so that the intensities of other light beams are substantially coincident with this fiducial value.

Note that when a specified light source 101 among those for the plurality of illumination optical systems LO1 to LO5 is replaced with a new light source, this new light source exhibits its luminance remarkably higher than those of other light sources, and it is therefore difficult to make a correction so that the intensities of the respective light beams are uniformized only by adjusting the applied voltage of the power supply 113 in this embodiment. In this case, the correction may be made to uniformize the intensities of the respective light beams of the illumination optical system by changing transmissivity of each of the transmissivity adjusting filters 114 disposed on the optical paths in the illumination optical systems LO1 to LO5.

Further, in accordance with the respective embodiments discussed above, the light intensity correcting element involves the use of the transmissivity adjusting filter, but an ND filter movable back and forth on the optical path of each illumination optical system is also available in other embodiments. In this case, a plurality of ND filters each having a different transmissivity are provided and may be used singly or in combination with each other.

Also, in accordance with the respective embodiments discussed above, the lens 106b is tilted to correct the slant unevenness. In other embodiments, however, the lens 103, close to the light source or the fly's eye lens is shifted in the arrowed direction in FIG. 5, thereby correcting the slant unevenness. In this case, it is desirable that no change of telecentricity be produced within the corresponding projection area.

Also, each of the embodiments discussed above has such a construction that the slant unevenness is corrected by tilting or shifting a lens in each illumination optical system. In accordance with other embodiments, the slant unevenness is corrected by use of a technique disclosed in, e.g., Japanese Patent Application Laid-Open No. 2-170152. To give a brief explanation, referring to FIG. 5 or FIG. 8, a substrate coated with a dielectric multi-layered film exhibiting an angular transmissivity characteristic is provided on the optical path between the lens system 106 and the fly's eye lens 104 of each of the illumination optical systems LO1 to LO5 so that an inclination angle to the optical axis of each of the illumination optical systems LO1 to LO5 is variable. The signal processor 112 transmits the light intensity distribution data on the photosensitive substrate 110 to an unillustrated inclination adjusting unit for changing an inclination of the substrate in each of the illumination optical systems LO1 to LO5. Based on the above light intensity distribution data, this inclination adjusting unit adjusts the inclination angle of the substrate in each of the illumination optical systems LO1 to LO5 to substantially uniformize the light intensity distribution in the scan orthogonal direction in each projection area. The light intensities can be thereby substantially uniformized all over the projection areas.

Note that a plano-parallel plate variable in terms of the inclination angle to the optical axis of each of the illumination optical systems LO1 to LO5 is provided on the light source side of the fly's eye lens 104 in other embodiments. The plano-parallel plate is tilted relative to the optical axis, whereby the light beams incident on the fly's eye lens 104 travel in parallel to the optical axis. Hence, the light intensity distribution on the incident surface of the fly's eye lens 104 changes. As a result, slant unevenness is caused on the light beams from the fly's eye lens 104 via the lens system 106. Accordingly, the inclination angle of the plano-parallel plate of each of the illumination optical systems LO1 to LO5 may be adjusted to correct the slant unevenness in each projection area in the scan orthogonal direction.

Further, each of the embodiments discussed above takes such a construction that the respective projection areas are partly overlapped with each other along the scan orthogonal as shown in FIG. 6. In accordance with other embodiments, however, there are not provided the illumination optical system and the projection optical system which form the projection areas PA2 and PA4 in FIG. 6. In this case, the mask 109 and the photosensitive substrate 110, after being scanned in the X-direction, are again scanned in the X-direction after shifting the mask 109 and the photosensitive substrate 110 by a predetermined distance in the Y-direction. The whole pattern areas on the mask can be thereby transferred on the photosensitive substrate.

Further, in the respective embodiments discussed above, the exposure apparatus using equi-powered projection optical systems has been described. The present invention is also, however, applicable to an exposure apparatus employing projection optical systems each having a predetermined magnification.

Moreover, in the respective embodiments discussed above, an exposure apparatus using a refracting projection optical systems has been explained. The present invention is also, however, applicable to an exposure apparatus employing reflecting projection optical systems.

Additionally, in the respective embodiments discussed above, the aperture of the field stop in each illumination optical system takes the trapezoidal shape. However, a field stop formed with, e.g., a hexagonal aperture may also be used.

As discussed above, the exposure apparatus according to the present invention is capable of correcting, the slant unevenness in each projection area in the scan orthogonal direction. Accordingly, the individual projection areas on the photosensitive substrate can be scan-exposed with a fixed exposure light quantity. As a result, the transferring accuracy is improved, and the quality of the manufactured device is remarkably enhanced.

Yet another embodiment of the present invention will be described with reference to the accompanying drawings.

Figure 10:
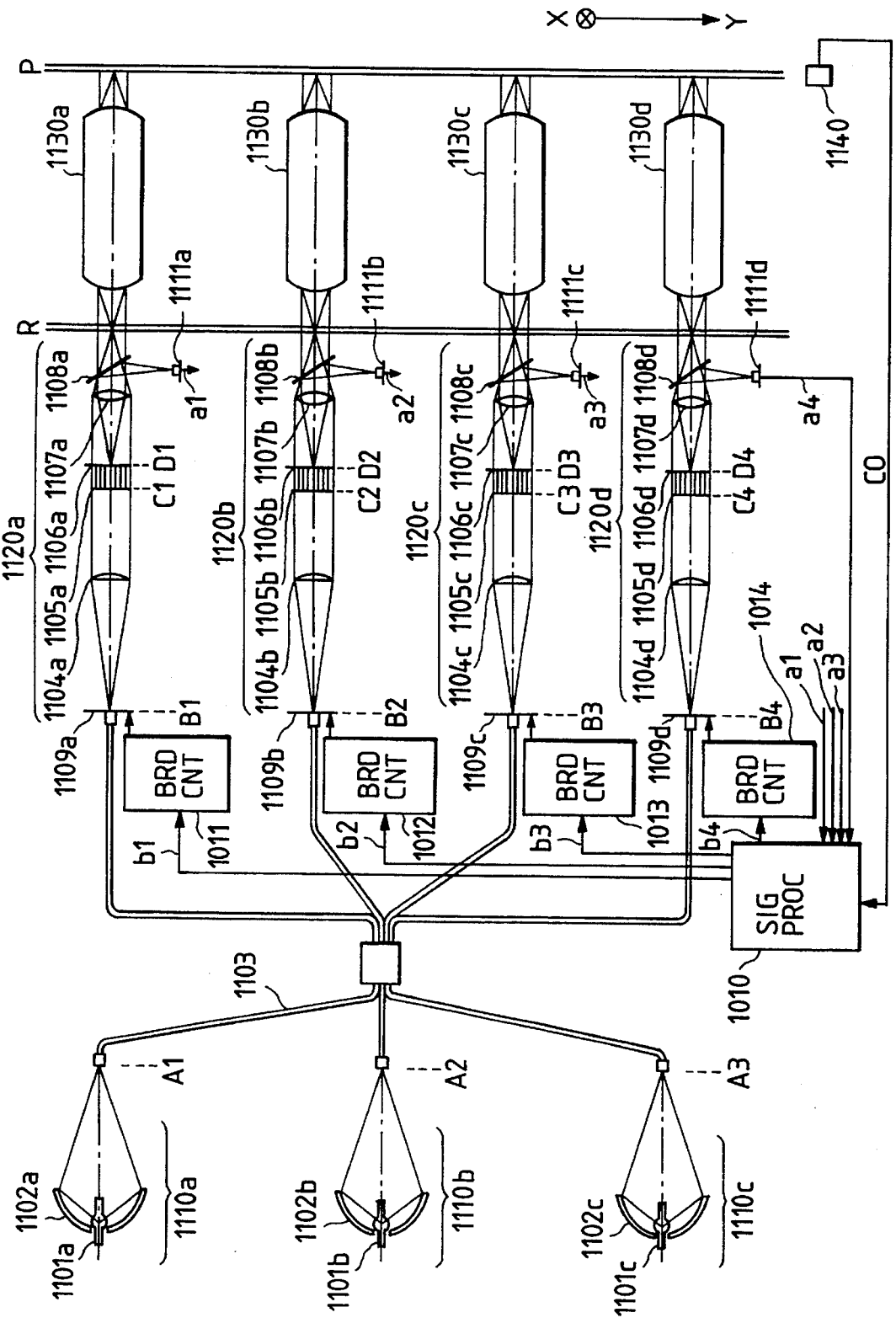
FIG. 10 is a diagram schematically illustrating a construction of an illumination optical apparatus in a further embodiment of the present invention.
Figure 11A:
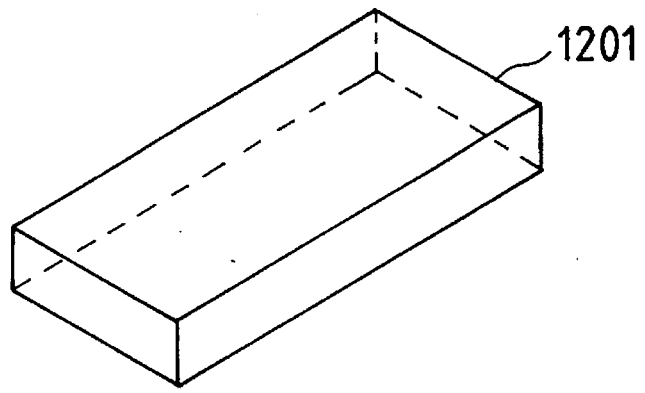
FIG. 11A is a perspective view of each lens element of an optical integrator of FIG. 10.
Figure 11B:
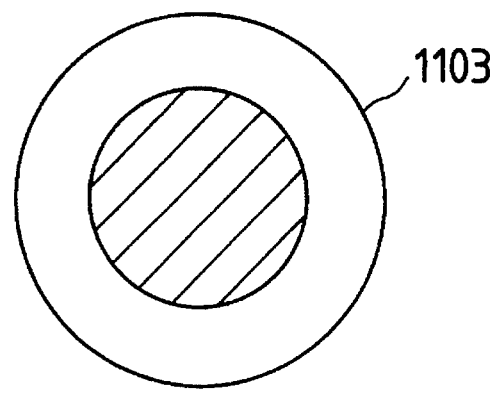
FIG. 11B is a sectional view of each incident end of a light guide of FIG. 10.
Figure 11C:
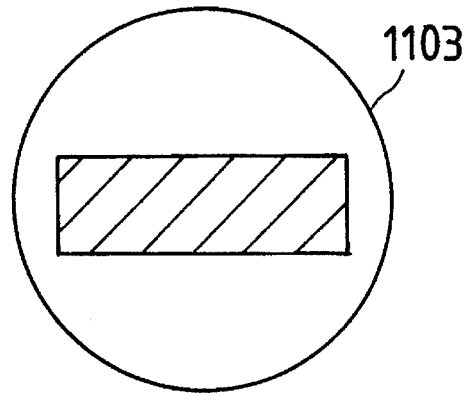
FIG. 11C is a sectional view of each exit end of the light guide of FIG. 10.

FIG. 10 is an explanatory view schematically illustrating a construction of an illumination optical apparatus in this embodiment of the present invention. Further, FIG. 11A is a perspective view of each lens element of the optical integrator of FIG. 10. FIG. 11B is a sectional view illustrating an incident end of the light guide of FIG. 10. FIG. 11C is a sectional view of each exit end of the light guide.

Note that FIG. 10 shows an example where the illumination optical apparatus of the present invention is applied to a projection exposure apparatus, and a plurality of projection optical systems are also illustrated together. Further, for clarifying the drawings, the illumination optical systems and the projection optical systems are spaced from each other in the up-and-down directions.

The illumination optical apparatus of FIG. 10 includes, e.g., three light supply elements 1110a to 1110c. The light supply elements are neither limited to 3 in their number nor necessarily constructed the same.

The light supply element 1110a is constructed of an elliptical mirror 1102a serving as a light converging member and a light source 1101a disposed in a first focal position of the elliptical mirror 1102a. The light source 1101a is a light source such as a mercury arc lamp for outputting light beams containing emission lines such as, e.g., g-line, h-line, i-line, etc.

The light beams emitted from the light source 1101a are converged by elliptical mirror 1102a and form an image of the light source in a second focal position A1 of the elliptical mirror 1102a. Similarly, light supply elements 1110b, 1110c individually form images of the light sources in positions A2, A3.

Thus, the light sources 1101a to 1101c constitute light source elements, while the three light supply elements 1110a to 1110c constitute multi-light-source-image forming elements.

The light beams of the light source images formed in the positions A1 to A3 are incident on respective incident ends of a light guide 1103 that are similarly located in the positions A1 to A3. The light guide 1103 is composed of a plurality of optical fibers bundled at random. The light guide 1103 has the same number of incident ends as the number of light sources (three in this embodiment) and also the same number of exit ends as the number of illumination areas (four in this embodiment). Note that the plurality of optical fibers forming the light guide 1103 are diverged with equal numbers from the exit ends as well as from the incident ends. Then, each incident end, as illustrated in FIG. 11B, takes a circular shape substantially similar to the image of the light source. Each exit end, as depicted in FIG. 11C, takes, e.g., a rectangular shape substantially similar to the shape of the illumination area. Note that the rectangular shape implies substantially a rectangle on the whole, i.e., a concept including all shapes similar to the rectangle such as a trapezoid, etc.

Thus, the light beams from the respective light source images formed in the positions A1 to A3 are individually incident on the corresponding incident ends of the light guide 1103 and, after being mixed at random, emerge from the respective exit ends while being split equally therefrom.

Figure 12A:
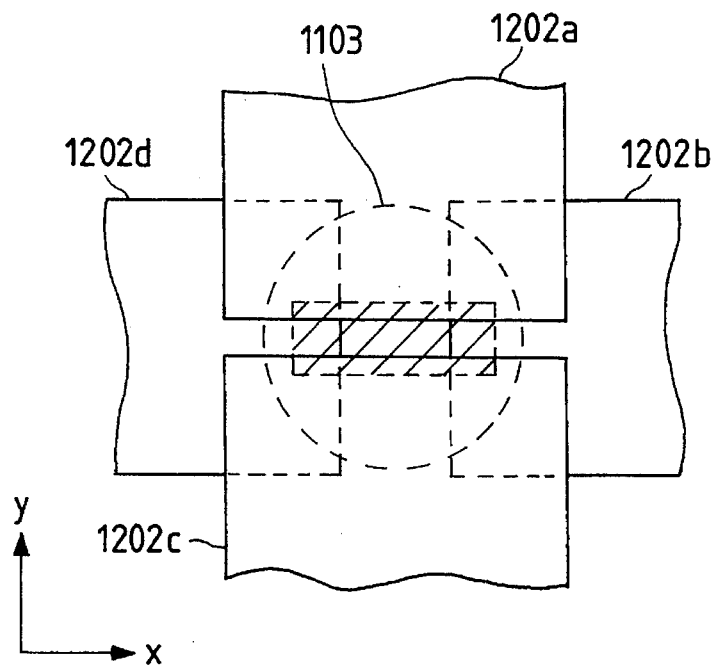
FIGS. 12A and 12B are views each illustrating a configuration of the blind of FIG. 10.

Blinds 1109a to 1109d are respectively located in the vicinities of positions B1 to B4 of the exit ends of the light guide 1103. Each blind is, as illustrated in FIG. 12A, constructed of four light shielding members 1202a to 1202d. Then, the light shielding members 1202a, 1202c are movable to approach each other or separate from each other in the y-direction, while the light shielding members 1202b, 1202d are also movable to approach each other or separate from each other in the x-direction. Note that the exit ends of the light guide 1103 are shown by the broken and oblique lines in FIGS. 12A and 12B.

In this manner, the front edges of the four light shielding members 1202a to 1202d form a rectangular aperture. Note that this aperture assumes a rectangular shape substantially similar to the shape of the illumination area, with the optical axis centered. Each light shielding member is drive-controlled by a blind driving unit which will be mentioned later so that the aperture changes to keep the rectangular shape substantially similar to the shape of the illumination area (in turn, the shape of each exit end of the light guide 1103), with the optical axis centered.

Thus, the light beams from the respective exit ends of the light guide 1103 are controlled in terms of their quantity in accordance with sizes of the aperture areas of the respective blinds.

Figure 12B:
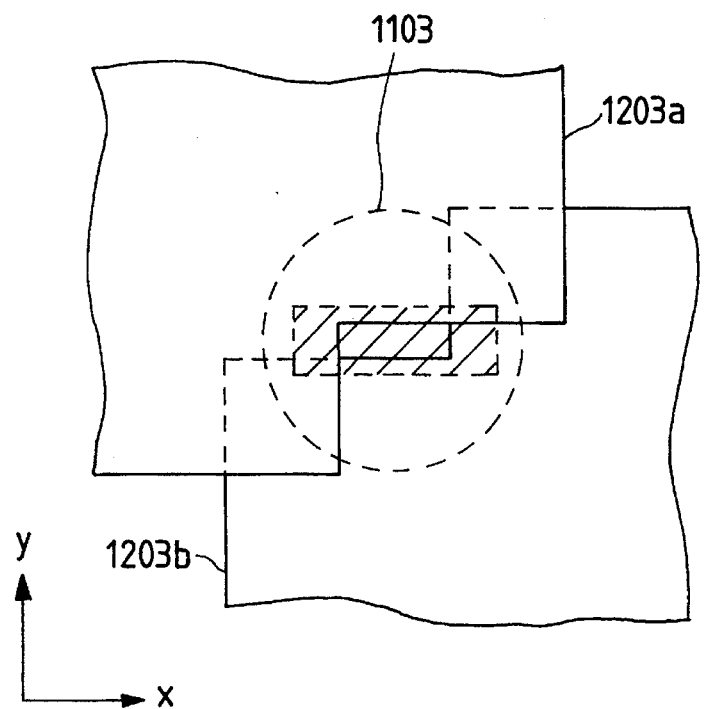

Note that each blind may be, as illustrated in FIG. 12B, constructed of two L-shaped light shielding members 1203a, 1203*b* as a modified example. In this modified example also, as a matter of course, the respective light shielding members are drive-controlled in a predetermined direction so that an aperture formed by the two light shielding members 1203*a*, 1203*b* changes to keep a rectangular shape substantially similar to the shape of the illumination area, with the optical axis centered.

Four illumination optical systems 1120*a* to 1120*d* each exhibiting the same configuration are disposed in parallel in positions posterior to the positions B1 to B4 of the exit ends of the light guide 1103. Accordingly, there will be explained a configuration of only the illumination optical system 1120*a*, and a repetitive explanation of the other illumination optical systems 1120*b* to 1120*d* will be omitted.

The light beams from the exit end located in the position B1 among the four exit ends of the light guide 1103 are incident on a collimator lens 1104*a* of the illumination optical system 1120*a*. The light beams passing through the collimator lens 1104*a* are collimated into parallel light beams and then fall on an optical integrator 1105*a* (its incidence surface is indicated by C1).

As illustrated in FIG. 11A, each of lens elements 1201 constituting the optical integrator 1105*a* has a section assuming a shape substantially similar to a shape (rectangular shape) of the corresponding illumination area. Then, the optical integrator 1105*a* is configured by arranging the plurality of lenses elements 1201 lengthwise and crosswise so as to form substantially a square section on the whole.

The light beams falling on the optical integrator 1105*a* are converged, with the result that a plurality of light source images (images at the exit ends of the light guide 1103 disposed in B1) are formed at an exit end D1 of the optical integrator 1105*a*.

The plurality of light source images formed at the exit end D1 of the optical integrator 1105*a* are shaped in a circular configuration by a circular aperture stop 1106*a* disposed immediately behind it. Rectangular areas on a mask surface R are uniformly illuminated with superposition of the light beams from the plurality of circularly-shaped light source images, which have passed through a condenser lens 1107*a*.

Similarly, other corresponding rectangular areas on the mask surface R are uniformly illuminated with superposition of the light beams respectively from other exit ends of the light guide 1103, which are disposed individually in the positions B2 to B4.

Note that a half-mirror 1108*a* serving as a light splitting member is provided between condenser lens 1107*a* and the mask surface R, whereby some of the illumination light is guided to a detector 1111*a* serving as a photoelectric detector. The detector 1111*a* receives the guided light and outputs a signal a1 obtained by photoelectric conversion to a signal processor 1010.

Further, in the other illumination optical systems 1120*b* to 1120*d* also, half-mirrors 1108*b* to 1108*d* are provided between condenser lenses 1107*b* to 1107*d* and the mask surface R, whereby some of the illumination light beams are guided to each of detectors 1111*b* to 1111*d*.

Inputted in this way to the signal processor 1010 are four signals a1 to a4 corresponding to the light intensities of the illumination light beams on the optical paths of the respective illumination optical systems 1120*a* to 1120*d*. Based on the inputted signals a1 to a4, the signal processor 1010 outputs control signals b1 to b4 to four blind controllers 1011 to 1014. The four blind controllers 1011 to 1014 individually control sizes of aperture areas of blinds 1109*a* to 1109*d* on the basis of input signals b1 to b4.

In this way, the half-mirrors 1108*a* to 1108*d* and the detectors 1111*a* to 1111*d* constitute a plurality of photo detecting elements for photoelectrically detecting the illumination light beams on the optical paths of the respective illumination optical systems. On the other hand, the signal processor 1010 and the blind controllers 1011 to 1014 constitute control elements for controlling the sizes of the aperture areas of the blinds 1109*a* to 1109*d* on the basis of outputs of the plurality of photo detecting elements.

Given next is an explanation of one example of controlling sizes of the aperture areas of the respective blinds, i.e., a blind control sequence.

The signal processor 1010 sets the minimum value among the input signals a1 to a4 as a fiducial value. Then, the control signals b1 to b4 are properly changed so that output values of the detectors 1111*a* to 1111*d* of the illumination optical systems other than the illumination optical system exhibiting the minimum value are substantially coincident with the fiducial value. The size of the aperture areas of the blinds 1109*a* to 1109*d* are respectively controlled by the blind controllers 1011 to 1014.

Thus, even if there is a scatter in terms of the transmissivity of each of the illumination optical systems 1120*a* to 1120*d*, some disconnections of the optical fibers constituting the light guide 1103 and also a scatter in terms of manufacturing, the individual illumination areas on the mask surface R can be irradiated substantially with a fixed illuminance.

Further, as explained above, unlike the method of interposing a combination of the plurality of ND filters in the optical path of each illumination optical system, the intensity of the illumination light can be consecutively changed without increasing the size of the apparatus. It is therefore possible to substantially uniformize the illuminance of each area on the mask surface R at a high accuracy.

Moreover, the illuminance on each exposure area of the photosensitive substrate surface P is controlled at a higher accuracy. For this purpose, it is necessary to correct the scatter in the transmissivity of each of the illumination optical systems 1120*a* to 1120*d* and of the projection optical systems 1130*a* to 1130*d*, differences in reflective index between the half-mirrors 1108*a* to 1108*d* and also individual differences between the detectors 1111*a* to 1111*d*.

For this reason, there is provided a photodetector 1140 having a light receiving surface movable within the same plane as the photosensitive substrate surface P. A preferable construction is that this photo detector 1140 is capable of detecting the illuminance in each of the exposure areas corresponding to the projection optical systems 1130*a* to 1130*d*.

Inputted thus to the signal processor 1010 are signals indicating the illuminances of the exposure areas corresponding to the projection optical systems in addition to the signals a1 to a4 representing the intensities of the illumination light beams in the illumination optical systems. Based on these items of data, the signal processor 1010 is capable of previously obtaining and storing relationships between the sizes of the aperture areas of the respective blinds, the detected values of the detectors and the illuminances in the exposure areas. Accordingly, referring to the stored relationships, adequate offsets are given to the control signals b1 to b4, and the above scatters and the individual differences are corrected, thereby making it possible to substantially uniformly control the illuminances of the areas of the photosensitive substrate surface P with high accuracy.

Note that the incident surface of each of the lens elements of the optical integrator is optically conjugate to the mask surface R, and, hence, a loss in the light quantity can be prevented by causing the section of the lens element to take a shape similar to the shape of the illumination area.

Further, the section of each incident end of the light guide element assumes substantially a circular shape (shape of the light source image). The section of each exit end of the light guide element takes a shape similar to the sectional shape of the lens element of the optical integrator, i.e., the section thereof is shaped in a configuration similar to the shape of the illumination area, whereby the efficiency of the light quantity can be enhanced.

Furthermore, in the embodiment discussed above, each aperture of the blind element assumes a shape similar to the shape of the illumination area, the sectional shape of the lens element of the optical integrator and the sectional shape of each exit end, thereby making it possible to enhance the efficiency of the light quantity.

Additionally, each aperture of the blind element varies with the optical axis centered, and, therefore, a position of the centroid of the light quantity of the image of the exit surface of the optical integrator which is formed on a pupil surface of each of the plurality of projection optical systems is invariable irrespective of a change in size of the aperture area of the blind element. As a result, when effecting the blind control, this neither exerts an adverse influence on the telecentricity of the exposure light beams nor deteriorates performance of resolution of the projection optical system.

Note that the above-described embodiment exemplifies the construction of guiding the light source image formed by each light supply element to the exit end of the light guide. It is, however, obvious that the same number of light supply elements as the plurality of illumination areas are provided with an omission of the light guide, and the blinds are disposed in the vicinities of the plurality of formed light source images. In this case, it is desirable that the aperture of each blind takes not a rectangular shape but a circular shape.

As discussed above, in the illumination optical apparatus according to the present invention, the illumination light beams of the illumination optical systems are sequentially detected, and the size of the aperture areas of the blind through which the illumination light beams passes can be controlled based on the detected result. Accordingly, each illumination area on the object such as the mask can be irradiated substantially with uniform illuminance.

It is apparent that, in this invention, a wide range of different working modes can be formed based on the invention without deviating from the spirit and scope of the invention. This invention is not restricted by its specific working modes except being limited by the appended claims.

What is claimed is:

1. An exposure apparatus for projection exposing a predetermined pattern of a mask on a photosensitive substrate through projection optical systems while said mask and said photosensitive substrate are moved in a predetermined direction with respect to said projection optical systems, said exposure apparatus comprising:

a plurality of illumination optical systems which respectively illuminate a plurality of illumination areas on said mask;

a plurality of projection optical systems which respectively form images of said plurality of illumination areas on said mask in a corresponding plurality of projection areas on said photosensitive substrate;

a detector which detects a light intensity distribution, along a direction orthogonal to the predetermined direction, in each of the plurality of projection areas on said photosensitive substrate; and a controller which controls said plurality of illumination optical systems to substantially equalize the light intensity distribution in each of the plurality of projection areas on said photosensitive substrate along the direction orthogonal to the predetermined direction, based on detection results of said detector.

2. The exposure apparatus according to claim 1, wherein said controller has lens drivers which tilt a predetermined lens in each of said illumination optical systems within a plane including the direction orthogonal to the predetermined direction and an optical axis of the illumination optical system.

3. The exposure apparatus according to claim 2, wherein each of said plurality of illumination optical systems has an optical integrator which forms a multiplicity of secondary light sources based on light beams from a light source and a light converging optical system which converges light beams from said optical integrator, and said predetermined lens is a negative lens among lenses constituting said light converging optical system.

4. The exposure apparatus according to claim 1, wherein said controller has lens drivers which shift a said predetermined lens in each of said illumination optical systems in the direction orthogonal to the predetermined direction.

5. The exposure apparatus according to claim 4, wherein each of said plurality of illumination optical systems has a lens system which collimates the light beams from light sources in said plurality of illumination optical systems into parallel light beams and an optical integrator which forms a multiplicity of secondary light sources based on the parallel light beams through said lens system, and said predetermined lens is a positive lens among lenses constituting said lens system.

6. The exposure apparatus according to claim 1, wherein said controller has lens drives which tilt a substrate disposed in said illumination optical systems and is coated with a dielectric multi-layered film exhibiting an angular transmissivity property.

7. The exposure apparatus according to claim 1, further comprising:

a second detector which detects an intensity of light beams of each of said plurality of illumination optical systems; and a second controller which controls each of said plurality of illumination optical systems to substantially equalize the intensity of the light beams of each of said plurality of illumination optical systems based on detection results of said second detector.

8. The exposure apparatus according to claim 7, wherein said second controller has a transmissivity adjusting filter disposed on an optical path of each of said illumination optical systems controls the transmissivity of said transmissivity adjusting filter.

9. The exposure apparatus according to claim 7, wherein said second controller sets, as a fiducial value, the minimum value of intensities of the light beams of said illumination optical systems respectively.

10. The exposure apparatus according to claim 7, wherein said second controller controls an output of a light source of each of said illumination optical systems.

11. The exposure apparatus according to claim 1, wherein said illumination optical systems have a single light source and a plurality of light guide elements.

12. The exposure apparatus according to claim 1, wherein said illumination optical system have a plurality of light sources, respectively.

13. An illumination optical apparatus for illuminating a plurality of illumination areas on an object with light beams, said apparatus comprising:

a light source device which supplies illumination light beams;

a multi-light-source-image forming device which forms light source images in spatially separated positions by converging the illumination light beams from said light source device;

a plurality of blind devices respectively disposed in the positions of the light source images formed by said multi-light-source-image forming device and formed with variable apertures each assuming a predetermined shape;

a plurality of illumination optical systems which illuminate the illumination areas on the object with the illumination light beams from the light source images by respectively converging the illumination light beams from the light source images through said blind devices;

a plurality of photo detectors which photoelectrically detect the illumination light beams on optical paths of said illumination optical systems; and a controller which controls sizes of the apertures of said plurality of blind devices based on outputs from said plurality of photo detectors to equalize illuminance in the plurality of illumination areas on the object.

14. The illumination optical apparatus according to claim 13, wherein said light source device has a plurality of light sources emitting illumination light beams having the same wavelength, said multi-light-source-image forming device has a plurality of light converging members which form the light source images by converging the illumination light beams from said plurality of light sources and light guide elements which relay respective light source images formed by said plurality of light converging members to the spatially separated positions, and said blind devices are disposed respectively at exit ends of said light guide elements.

15. The illumination optical apparatus according to claim 14, wherein an incident end of each light guide element has a circular shape in section, and the exit end of each light guide element has a sectional shape similar to the shape of a corresponding illumination area on the object.

16. The illumination optical apparatus according to claim 15, wherein the exit end of each of said light guide elements has a rectangular shape, and each blind device has four plates having rectilinear edges that form a rectangular aperture.

17. The illumination optical apparatus according to claim 16, wherein a centroid of the aperture of each blind device coincides with an optical axis therethrough.

18. The illumination optical apparatus according to claim 15, wherein the exit end of each of said light guide elements has a rectangular shape, each blind device has two plates having L-shaped edges, and a rectangular aperture is formed by the L-shaped edges.

19. The illumination optical apparatus according to claim 18, wherein a centroid of the aperture of each blind device coincides with an optical axis therethrough.

20. The illumination optical apparatus according to claim 13, wherein said multi-light-source-image forming device has light converging members which form the light source images by converging the illumination light beams from said light source device and light guide elements which relay the light source images formed by said light converging members to the spatially separated positions, and said blind devices are disposed respectively at exit ends of said light guide elements.

21. The illumination optical apparatus according to claim 13, wherein said photo detectors have light splitting members disposed, respectively, on optical paths of said illumination optical systems and devices which receive illumination light beams through said light splitting members, respectively, and photoelectrically convert the illumination light beams.

22. The illumination optical apparatus according to claim 13, wherein said controller controls sizes of the apertures of said plurality of blind devices so that an output from each photo detector is substantially coincident with a minimum of the outputs from said plurality of photo detectors.

23. The illumination optical apparatus according to claim 13, wherein each of said illumination optical systems has a collimator lens which collimates illumination light beams through said blind devices into parallel light beams, an optical integrator which forms a plurality of light source images based on the parallel light beams from said collimator lens and a condenser lens which illuminates the object with superposed light beams formed by condensing light beams from the plurality of light source images.

24. The illumination optical apparatus according to claim 13, comprising:

a further detector which detects an illuminance of each of the illumination areas, wherein the aperture area of each blind device is so controlled as to be corrected based on a detection result of said further detector.

25. An exposure apparatus for exposing a pattern of a mask to a substrate, comprising:

a light source device which generates a plurality of light beams that illuminate corresponding spatially separated portions of the pattern of the mask;

a plurality of detectors which detect the intensities of the light beams, respectively; and a regulator which regulates the intensities of the light beams based on the intensities detected by the detectors so that the intensities of the light beams that illuminate the respective spatially separated portions of the pattern of the mask are substantially equalized, whereby portions of the substrate corresponding to respective spatially separated portions of the pattern of the mask may be exposed substantially equally.

26. An exposure apparatus comprising:

a plurality of illumination optical systems disposed to illuminate respective spatially separated portions of a mask;

a plurality of projection optical systems disposed so as to correspond to said plurality of illumination optical systems, respectively, to project light from said portions of said mask onto a substrate;

a plurality of light intensity detectors which are associated with said plurality of projection optical systems, respectively, and which detect individual intensities of illumination of the separated portions of the mask;

a light intensity changing device for changing the intensities of illumination of the separated portions of the mask; and a control device which controls said light intensity changing device, based on the individual intensities of illumination detected by the detectors, so as to equalize the intensities of illumination substantially to a predetermined level.

27. The exposure apparatus according to claim 26, wherein said control device controls said light intensity changing device so that said predetermined level corresponds to a minimum value of the individual intensities.

28. The exposure apparatus according to claim 26, comprising a further light intensity detector aligned with a plane of said substrate, said further light intensity detector detecting intensity of illumination of each of a plurality of separated portions of said substrate.

29. The exposure apparatus according to claim 28, wherein said control device corrects results of detection by said plurality of light intensity detectors based on a result of detection by said further light intensity detector and results of detection by said plurality of light intensity detectors.

30. The exposure apparatus according to claim 28, further comprising a device which moves said further light intensity detector in two dimensions.

31. The exposure apparatus according to claim 30, wherein said control device, in advance of an exposure, controls said light intensity changing device to change the illumination of the spatially separated portions of the mask based on detection by said further light intensity detector, and, during an exposure, maintains the equalized intensities of illumination by controlling said light intensity changing device.

32. The exposure apparatus according to claim 26, wherein said light intensity changing device has a member exhibiting a transmittance lower than transmittance of optical elements constituting each of said illumination optical systems.

33. An exposure apparatus in which a pattern on a mask is exposed to a substrate through a projection optical system, comprising:
   a light source which illuminates at least two areas on said mask;
   a plurality of first detectors which detect the intensity of illumination of said areas on said mask;
   a second detector which detects the intensity of illumination of areas on said substrate; and
   a calculator which calculates an offset value for detection results of said first detectors based on the detection results of said first detectors and a detection result of said second detector.

34. A method of exposing a pattern of a mask to a substrate, comprising:
   generating a plurality of light beams that illuminate corresponding spatially separated portions of the pattern of the mask;
   detecting the intensities of the light beams, respectively; and
   regulating the intensities of the light beams based on the detected intensities so that the intensities of the light beams that illuminate the respective spatially separated portions of the pattern of the mask are substantially equalized, whereby portions of the substrate corresponding to respective spatially separated portions of the pattern of the mask may be exposed substantially equally.

35. An exposure method comprising:
   illuminating respective spatially separated portions of a mask;
   projecting light from said portions of said mask onto a substrate;
   detecting individual intensities of illumination of the separated portions of the mask;
   changing the intensities of illumination of the separated portions of the mask; and
   controlling said changing, based on the detected individual intensities of illumination, so as to equalize the intensities of illumination substantially to a predetermined level.

36. The exposure method according to claim 35, wherein said controlling controls said light intensity changing so that said predetermined level corresponds to a minimum value of the individual intensities.

37. The exposure method according to claim 35, further comprising detecting intensity of illumination of each of a plurality of separated portions of said substrate; and
   correcting results of the first-mentioned detecting based thereon and on the results of the further detecting.

38. The exposure method according to claim 35, wherein, in advance of an exposure, said controlling controls said changing to change the illumination of the spatially separated portions of the mask based on said detecting, and during an exposure, controls said changing to maintain the equalized intensities of illumination.

39. An exposure method for projection exposing a predetermined pattern of a mask on a photosensitive substrate while said mask and said photosensitive substrate are moved in a predetermined direction, comprising:
   illuminating a plurality of illumination areas on said mask with respective light beams;
   projecting images of said plurality of illumination areas on said mask in a corresponding plurality of projection areas on said photosensitive substrate;
   detecting a light intensity distribution, along a direction orthogonal to the predetermined direction, in each of the plurality of projection areas on said photosensitive substrate; and
   controlling said illuminating to substantially equalize the light intensity distribution in each of the plurality of projection areas on said photosensitive substrate along the direction orthogonal to the predetermine direction, based on said detecting.

40. The exposure method according to claim 39, further comprising:
   detecting intensities of said light beams, respectively; and
   controlling, in response to the last-mentioned detecting, the intensities of said light beams to substantially equalize the intensities.

41. A method for illuminating a plurality of illumination areas on an object with light beams, comprising:
   supplying illumination light beams;
   forming light source images in spatially separated positions by converging the illumination light beams;
   providing a plurality of variable apertures in the positions of the light source images;
   illuminating the plurality of illumination areas on the object with illumination light beams from the light source images that are converged after passing through said apertures;
   photoelectrically detecting the last-mentioned illumination light beams; and
   controlling sizes of said apertures based on said detecting to equalize illuminances in the plurality of illumination areas on the object.

42. The method according to claim 40, wherein said controlling controls sizes of said apertures so that a detection result of said detecting is substantially coincident with a minimum detection result.

43. The method according to claim 40, further comprising detecting an illuminance of each of the illumination areas, and wherein said controlling controls sizes of said apertures based on said further detecting.

* * * * *